United States Patent
Atanackovic

(10) Patent No.: US 10,276,667 B1
(45) Date of Patent: Apr. 30, 2019

(54) HIGH VOLTAGE BREAKDOWN TAPERED VERTICAL CONDUCTION JUNCTION TRANSISTOR

(71) Applicant: Silanna Asia Pte Ltd, Singapore (SG)

(72) Inventor: Petar Atanackovic, Henley Beach South (AU)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 15/994,200

(22) Filed: May 31, 2018

(51) Int. Cl.
| | |
|---|---|
| *H01L 21/00* | (2006.01) |
| *H01L 29/16* | (2006.01) |
| *H01L 29/78* | (2006.01) |
| *H01L 29/66* | (2006.01) |
| *H01L 29/10* | (2006.01) |

(52) U.S. Cl.
CPC ...... *H01L 29/1608* (2013.01); *H01L 29/1058* (2013.01); *H01L 29/66712* (2013.01); *H01L 29/781* (2013.01)

(58) Field of Classification Search
CPC ............. H01L 29/1608; H01L 29/1058; H01L 29/66712; H01L 29/781
See application file for complete search history.

(56) References Cited

U.S. PATENT DOCUMENTS

| | | | |
|---|---|---|---|
| 2,984,752 | A | 5/1961 | Giacoletto |
| 6,121,633 | A * | 9/2000 | Singh .................. H01L 29/1608 257/212 |
| 2009/0278177 | A1 | 11/2009 | Sankin et al. |
| 2011/0049532 | A1 | 3/2011 | Odekirk et al. |
| 2012/0205670 | A1 | 8/2012 | Kudou et al. |
| 2013/0341645 | A1 | 12/2013 | Hayashi |
| 2015/0349097 | A1 | 12/2015 | Konrath et al. |

* cited by examiner

*Primary Examiner* — Nicholas J Tobergte
(74) *Attorney, Agent, or Firm* — The Mueller Law Office, P.C.

(57) ABSTRACT

A vertical conduction junction transistor apparatus includes a multilayered semiconductor unit cell that has a substrate, epitaxial drift layer, epitaxial channel layer, gate region and channel control region. The substrate is silicon carbide (SiC). The epitaxial drift layer comprises SiC and is formed on the top surface of the substrate. The epitaxial channel layer comprises SiC and is formed on a top surface of the epitaxial drift layer, where a sidewall of the epitaxial channel layer is at an angle to the vertical direction. The gate region is formed in the sidewall of the epitaxial channel layer, the gate region having an inner gate region boundary that is parallel to the sidewall. The channel control region is in the epitaxial channel layer and has a width bounded by the inner gate region boundary. The channel control region has a trapezoidal cross-section in a plane taken in the vertical direction.

20 Claims, 30 Drawing Sheets

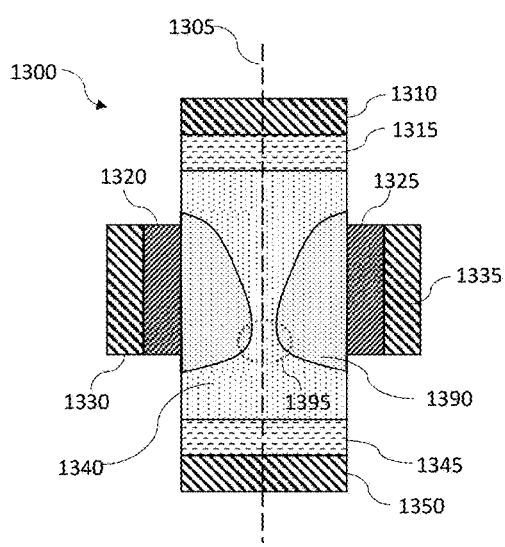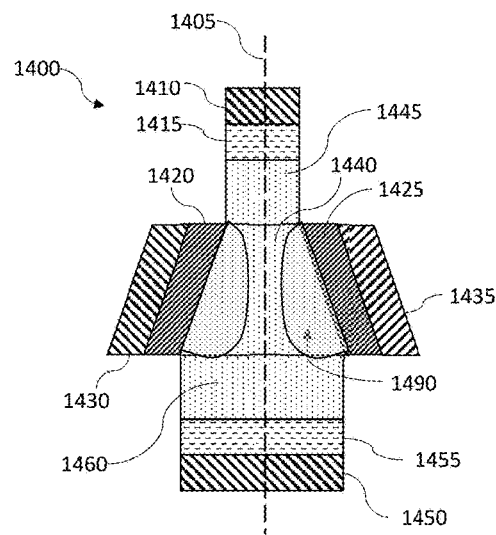
FIG. 15
(Prior Art)
FIG. 16

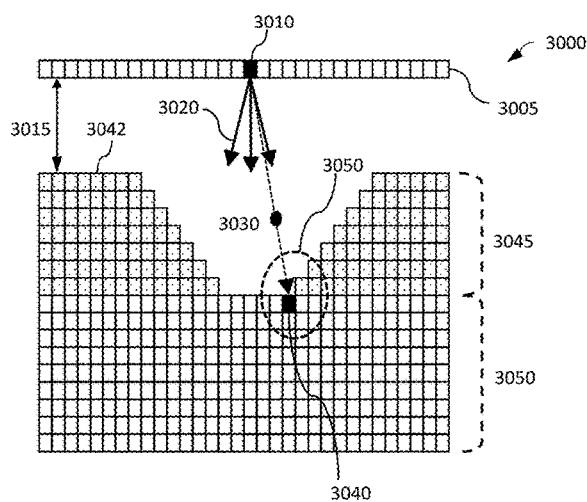
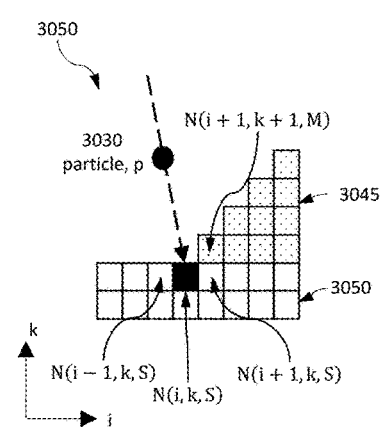
FIG. 30A
FIG. 30B

HIGH VOLTAGE BREAKDOWN TAPERED VERTICAL CONDUCTION JUNCTION TRANSISTOR

BACKGROUND

Energy efficient power management technologies are fundamentally based upon semiconductor switches. These switches manage power from the watt (W) level to the megawatt (MW) scale. Silicon has been the workhorse for such switches enabled by the insulated gate bipolar transistor (IGBT). Digital power management technologies continue to advance, offering dramatic improvements to power conversion efficiency. Power conversion efficiency of alternating-current to direct-current (AC-DC) and direct-current to direct-current (DC-DC) converters now approach 80-90%. An added benefit of high efficiency power converters is the reduction of losses and reduction in size of inverters and regulators required for controlling power systems. Silicon unfortunately is fundamentally limited in the material properties available for further improvements in reducing losses, reducing cost and increasing performance of the switches required for next generation power converters. A key limitation of silicon is the intrinsic electrical breakdown strength available by the material chemical purity and crystalline structure, which now severely limits how small a switching device can be made and the conversion efficiency that is possible. The critical parameters for an electrical switch are the ON-resistance, the switching or gate capacitance, the breakdown voltage capability of the device, and the thermal conductivity of the semiconductor.

As silicon is fundamentally limited for fulfilling all the criteria listed above, there is a pressing need to explore new materials and devices that can improve the switching speed, increase the breakdown voltage tolerance, reduce the conduction losses when in an ON-state and provide for material properties which enable improved thermal management of the device.

SUMMARY

In some embodiments, a vertical conduction junction transistor apparatus includes a multilayered semiconductor unit cell. The multilayered semiconductor unit cell includes a substrate, an epitaxial drift layer, an epitaxial channel layer, a gate region and a channel control region. The substrate is a silicon carbide (SiC) substrate, where a vertical direction of the multilayered semiconductor unit cell is perpendicular to a top surface of the substrate. The epitaxial drift layer comprises SiC and is formed on the top surface of the substrate. The epitaxial channel layer comprises SiC and is formed on a top surface of the epitaxial drift layer, where a sidewall of the epitaxial channel layer is at an angle to the vertical direction such that the epitaxial channel layer is tapered. The gate region is formed in the sidewall of the epitaxial channel layer, the gate region having an inner gate region boundary that is parallel to the sidewall. The channel control region is in the epitaxial channel layer and has a width bounded by the inner gate region boundary. The channel control region has a trapezoidal cross-section in a plane taken in the vertical direction.

In some embodiments, a method for forming a vertical conduction junction transistor includes providing a substrate, the substrate being a silicon carbide (SiC) substrate. A vertical direction of the vertical conduction junction transistor is perpendicular to a top surface of the substrate. A plurality of epilayers comprising SiC is formed on the top surface of the substrate. The plurality of epilayers includes an epitaxial channel layer. A sacrificial mask layer is formed on a top surface of the plurality of epilayers. A photoresist layer is formed on a top surface of the sacrificial mask layer. The method also includes selectively removing a portion of the photoresist layer, where a remaining portion of the photoresist layer has a first feature that is at an angle to the vertical direction. A portion of the sacrificial mask layer is selectively removed by using the remaining portion of the photoresist layer as a mask, where a remaining portion of the sacrificial mask layer has a second feature that is at an angle to the vertical direction. The second feature is used to form a sidewall in the epitaxial channel layer, the sidewall being at an angle to the vertical direction. A gate region is formed in the sidewall, the gate region having an inner gate region boundary that is parallel to the sidewall. A channel control region in the channel layer has a width bounded by the inner gate region boundary and has a cross-section that is trapezoidal in a plane taken in the vertical direction.

BRIEF DESCRIPTION OF THE DRAWINGS

FIG. 15 shows depletion regions in operation of the conventional device of FIG. 13.

FIG. 16 shows depletion regions in operation of the device of FIG. 14, in accordance with some embodiments.

FIGS. 30A-30B are schematics of a mask erosion process during reactive ion etching to fabricate an angled sidewall, in accordance with some embodiments.

DETAILED DESCRIPTION

Figures 1A, 1B:
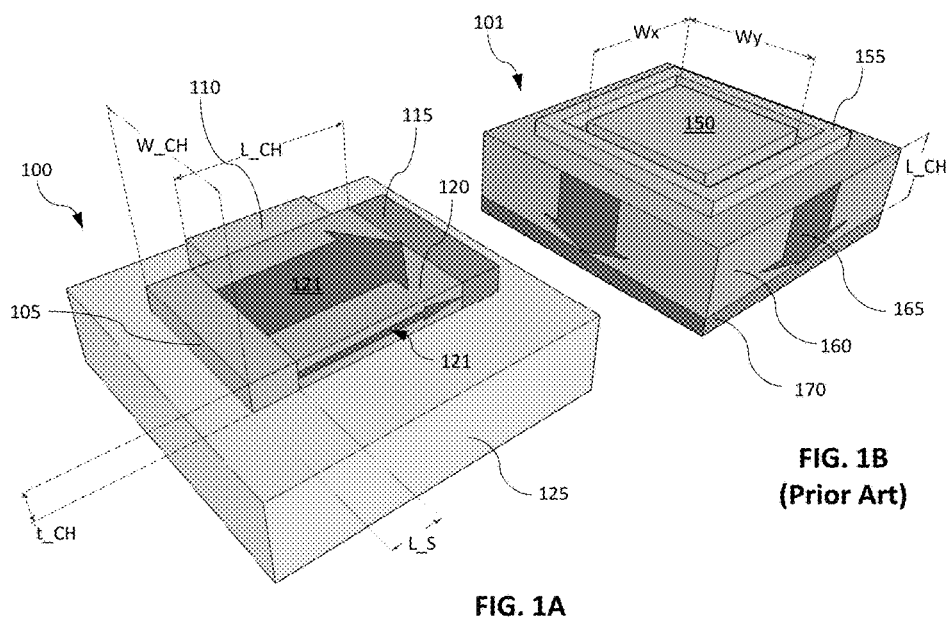
FIGS. 1A and 1B are perspective views of a lateral conduction device and a vertical conduction device, as known in the art.

The present disclosure describes vertical conduction junction transistors having improved current control and low-cost manufacturing methods that enable the requirements for improved power switches. The transistor devices have a tapered channel control region of a trapezoidal cross-section, which provides depletion regions that create a more uniform pinch-off region than conventional devices. Gate regions are formed on the angled sidewalls of the channel control region, such that an inner surface of the sidewall is tapered relative to the vertical axis of the device. The present embodiments improve switching speed and frequency of operation owing to the optimized and small gate control structures. The disclosed junction effect vertical conduction devices exhibit an advantageously smaller gate capacitance than comparable vertical conduction metal-oxide-semiconductor (MOS) type devices.

The present devices also incorporate a plurality of layers and regions where one of the layers of the multilayered structure is assigned to be a drift region that is separate from and has a different function and electronic carrier doping concentration than the channel layer and region defined therein, which enables improved control of the switching characteristics of the device. Namely, control is improved by the ON-resistance and breakdown voltage of the device substantially via the drift region layer, and the switching voltage for the channel layer and region for controlling the ON and OFF states of the switch by action of the control gate.

The present devices are high voltage breakdown switches using a semiconductor comprising silicon-carbide (SiC), such as a 4H—SiC polytype. The 4H—SiC crystal structure enables the semiconductor to exhibit the advantageous property of wide bandgap energy and high thermal conductivity. Many polytypes of SiC exist (e.g., 6H, 4H, 3H etc.); however, the 4H polytype is ideal for bulk crystal growth and presents the largest band gap energy (3.23 eV @ 300K). For electrical switching applications and in particular unipolar switching, indirect bandgap semiconductors such as SiC are superior to the direct bandgap semiconductors. This is because of the fundamental physical processes such as radiative recombination and avalanche breakdown mechanisms.

Silicon-carbide is a group-IV semiconductor and readily transformed from intrinsic, n-type and p-type conductivity type. In fact, common and mature ion-implantation methods can be used to implant impurity atoms directly into the SiC host crystal and thus manipulate the conductivity type with high absolute and spatial precision. Additionally, the 4H—SiC (0001) crystal is polar along the c-axis and exhibits a unique carbon- and silicon-face. Therefore, (0001) oriented surfaces can also be prepared to exhibit Si-face or (000-1) C-face. The devices and methods of this disclosure advantageously present 4H—SiC crystal surfaces when exposed for improved electrical contact with metal conductors. Silicon-carbide (SiC) single crystal semiconductor exhibits highly advantageous materials properties such as wide bandgap energy and high voltage breakdown strength. Although embodiments shall be described herein primarily in terms of 4H—SiC, other polytypes of SiC such as 6H—SiC may also be used. Other substrates are also possible that have the property of being able to incorporate the use of wideband gap semiconductor material such as SiC or other compound semiconductors.

In this disclosure, the terms "channel control region" and "channel region" shall be used interchangeably. A drain layer may also be referred to as a drain ohmic layer or a drain ohmic semiconductor layer. Similarly, a source layer may be referred to as a source ohmic layer or a source ohmic semiconductor layer. Also, a "substrate structure" or "SiC article" shall refer to a substrate with epilayers that have been formed on the substrate.

Vertical Switches

In general, electrical switches are three-terminal devices, having an input terminal, an output terminal and a control terminal. Bi-stable two-terminal switches are also possible; however, 3-terminal devices offer superior attributes, such as, efficiency and switching energy. Electrical switches can have either a lateral or a vertical configuration, where the use of lateral versus vertical device operation is selected depending on the switching application, for example, power management devices or high frequency switching for radiofrequency applications.

FIG. 1A shows a perspective view of a conventional lateral conduction device 100, while FIG. 1B shows a conventional vertical conduction device 101. The lateral switch 100 in FIG. 1A is implemented in 4H—SiC and includes a substrate 125 on which a source 105, a gate 110, a drain 115, and channel 120 are mounted. The conducting channel 120 has dimensions of L_CH×W_CH×t_CH and carries current as shown schematically by arrows 121. The lateral switch 100 conducts along channel 120 between the source 105 and drain 115 regions, while the gate 110 controls the conduction state of the channel 120. A current areal density $J_{lateral}$ therefore scales as $J_{lateral} \propto$ W_CH× t_CH. The lateral device 100 requires a large in-plane channel length L_CH to support a predetermined electrical breakdown voltage. Necessarily, the lateral device 100 requires a substantially insulating substrate 125 to prevent leakage from the channel 120.

In contrast, the vertical switch 101 of FIG. 1B has conducting substrate structure 160. Substrate structure 160 may include epilayers such as a channel layer and a drift layer, which are not depicted for clarity. A conduction channel (not visible) is positioned within the bulk of the substrate structure 160. The source 150, drain 170 and gate 155 control the channel conduction vertically through the device, indicated schematically by arrows 165. The channel volume scales as the area beneath the source region 150 and is given by Wx×Wy×L_CH, where Wx and Wy are horizontal dimensions of the source 150 and L_CH is the length of the channel layer (i.e., vertical thickness in FIG. 1B). A vertical current areal density $J_{vertical}$ scales as: $J_{vertical} \propto$ Wx× Wy. In the vertical device 101 the epilayer stack of substrate structure 160 is utilized to supply a large channel length L_CH to support the required electrical breakdown voltage $V_{BR}$. The cost per unit area of device is one of the most important parameters when assessing the commercial viability of a lateral or vertical power switch. As the handling of current in the switch is proportional to the area of the source contacting the channel, it can be seen by comparing FIGS. 1A and 1B that the vertical switch configuration of device 101 is area-efficient. Therefore, vertical conduction power switches utilize wafer area more efficiently than lateral topologies and achieve lower cost.

Figure 2:
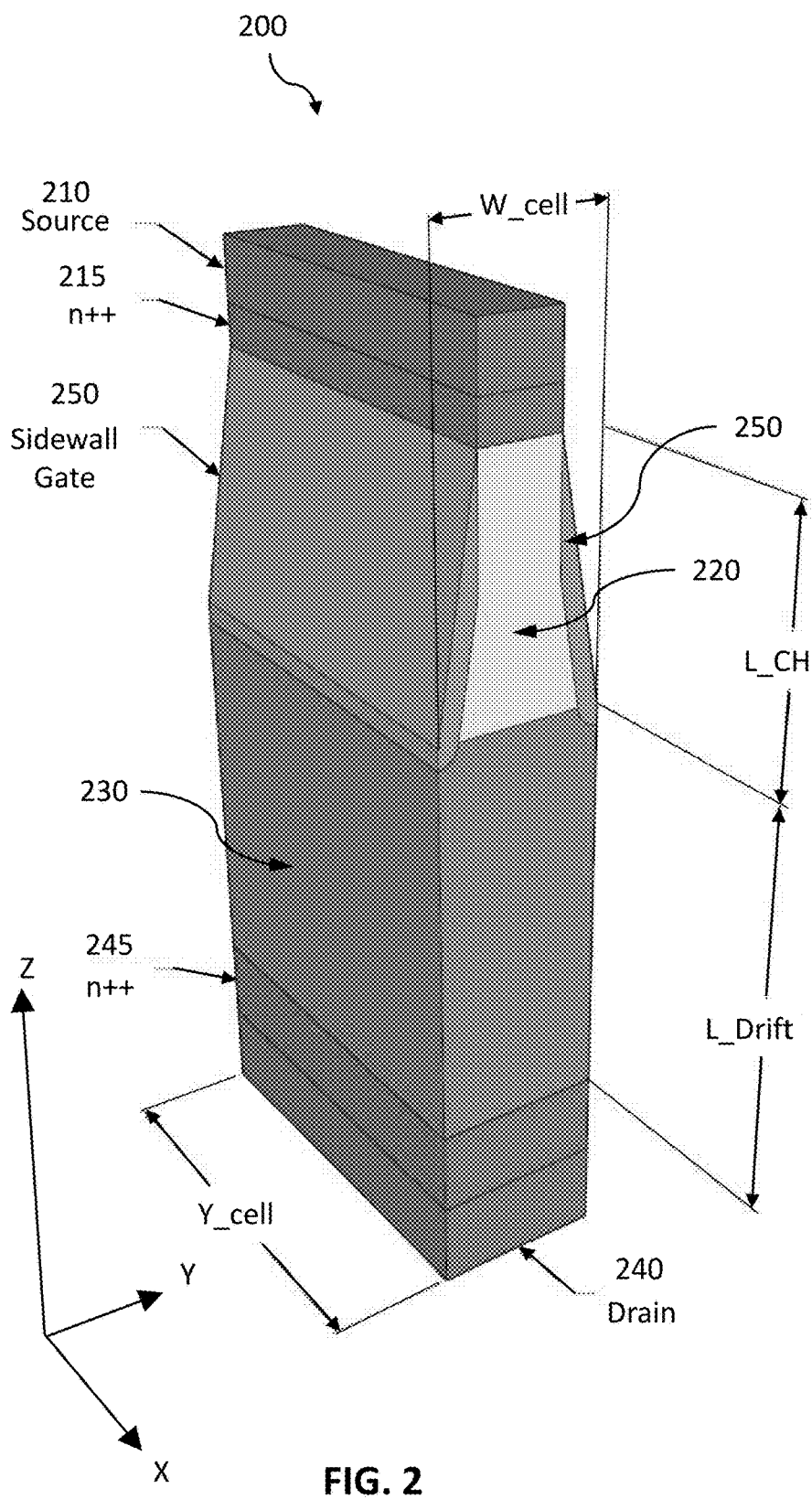
FIG. 2 is a perspective view of tapered vertical conduction junction transistor, in accordance with some embodiments.

FIG. 2 is a perspective view of tapered vertical conduction junction transistor with high voltage breakdown, in accordance with some embodiments. FIG. 2 is a three-dimensional cross-section of a portion of a unit cell 200 of a 3-terminal switch device implemented in 4H—SiC. The unit cell 200 of the device is described by a lateral dimension $W_{cell}$ such that a plurality of unit cells 200 are adjoined laterally to form the complete switch device. The finger length $y_{cell}$ can be equal to or longer than $W_{cell}$. The source 210 and drain 240 are shown with source layer 215 and drain layer 245 which are thin $n^{++}$ regions and serve as ohmic semiconductor layers. A channel region 220 is shown with a channel length $L_{CH}$, where the channel region 220 is uniquely tapered such that it has an approximately trapezoidal cross-section in the vertical plane of FIG. 2. Thus, the sidewalls of channel region 220 are sloped. Gate regions 250 are formed within the angled sidewalls of the channel layer, such that the channel region 220 is bounded by the gate regions 250. This tapered configuration of channel region 220 with angled gate regions 250 in the sidewalls of the channel region 220 provide a uniform current flow through the device, as shall be described in this disclosure. The blocking layer that provides the breakdown voltage control for the device is obtained by the drift layer 230 having length $L_{Drift}$, where the drift layer is specifically designed to provide the rated breakdown voltage of the device in the OFF-state (i.e., insulating). The drift layer thickness and doping level must also serve as a low resistance (high conductance) and thus low ohmic loss layer when in the conducting ON-state. This trade-off between doping level and thickness is described below.

Voltage Breakdown

Figure 3:
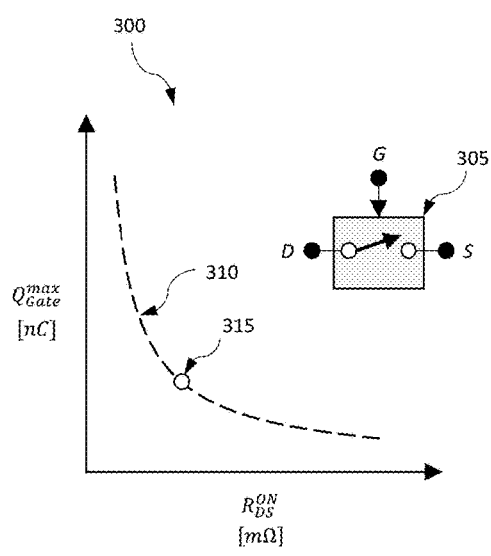
FIG. 3 is a graph of gate control capacitance as a function of ON-state resistance for a three-terminal switch, as known in the art.

FIG. 3 provides a graph 300 of a 3-terminal switch operating characteristic, showing a curve 310 of the variation in gate control capacitance $V_{Gate}^{max}$ versus the ON-state resistance $R_{DS-on}$ for vertical switch technology. FIG. 3 shows how the ON-resistance $R_{DS-on}$ versus gate capacitance $Q_{Gate}$ can be traded-off for a general power switch 305 having a gate G, source S and drain D. The switching performance FOM=$R_{DS-on} \times Q_{Gate}$ is an important figure-of-merit for a power switch where in general, the optimal switch performance is when the product $R_{DS-on} \times Q_{Gate}$ is minimized. The ideal operating point of the switch is shown as point 315 in FIG. 3, where the FOM is minimized in order to attain optimal device performance with respect to switching speed and losses. This enables the lowest conduction loss and fastest switching time for the switch. Desirable switch performance for power management is for $R_{DS-on} \leq 1\Omega$ and $Q_{Gate} \leq 100$ nC such that the device exhibits $0 \leq FOM \leq 100$ $\Omega \cdot nC$, and more preferably $R_{DS-on} \leq 100$ m$\Omega$ and $Q_{Gate} \leq 10$ nC enabling a switch capable of ~10 kHz to 10 MHz or higher frequency operation. Low gate charge $Q_{Gate}$ enables faster switching and recovery times, and smaller switching losses. Higher frequency operation approaching 100 kHz-10 MHz enables smaller DC-DC and AC-DC converters to be made due to the physically smaller capacitances and inductances required.

Figure 4:
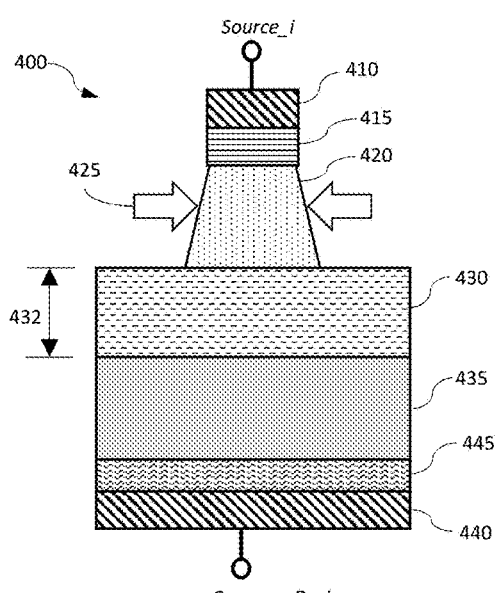
FIG. 4 is a vertical cross-sectional view showing schematic functional blocks of a vertical switch, in accordance with some embodiments.

FIG. 4 shows schematic functional blocks of a vertical switch 400 having separate channel control and breakdown voltage control regions, in accordance with some embodiments. Switch 400 has a source electrode 410, a source layer 415 (which may also be referred to as a source ohmic layer or a source ohmic semiconductor layer in this disclosure), a channel layer 420, a drift layer 430, a substrate 435, a drain layer 445 (which may also be referred to as a drain ohmic layer or a drain ohmic semiconductor layer in this disclosure), and a drain electrode 440. Substrate 435, drift layer 430, channel layer 420 and source ohmic layer 415 may all be a polytype of SiC, such as 4H—SiC. Device operation is partitioned into two sections, (i) the gate control of the conduction channel between the source electrode 410 and the drain electrode 440, and (ii) a high voltage breakdown drift region 430 that provides the required blocking voltage performance. Arrows 425 indicate gate control of the channel layer 420, where a channel control state of zero is when the device 400 is off. Breakdown control is achieved in drift layer 430 by controlling the layer thickness 432 and the charge carrier density $N_D$ in the drift layer 430.

In FIG. 4, the physical thickness 432 of the crystalline 4H—SiC material of drift layer 430 that is required to withstand a predetermined high voltage in the blocking state is determined primarily by the carrier type, activated carrier concentration and crystal quality. Having a drift layer that is separately configurable from the doping of the channel layer is one of the benefits of the vertical switches of the present embodiments. Furthermore, the forward voltage drop during current conduction is larger for devices with higher breakdown voltage capability, so it is important to obtain a device breakdown voltage capability as close as possible to the intrinsic capability of the semiconductor material for optimum device performance.

The breakdown voltage of 4H—SiC is calculated from the critical breakdown field $E_{Crit}$ using the relation $$V_{BR} = \frac{\varepsilon_{SiC} E_{Crit}^2}{2qN_D},$$

where $\varepsilon_{sic}$ is the dielectric constant, q is the electron charge, and $N_D$ is the charge carrier density. A 4H—SiC semiconductor layer of given doping density can be made thick enough to support the reverse-biased depletion layer width at breakdown. However, if the blocking semiconductor layer thickness is smaller than a thickness required to reach full depletion, then the device will punch through; that is, the depletion layer will reach the $n^+$-$n^-$ interface prior to breakdown. Therefore, when the reverse bias increases further, the device will breakdown prematurely.

Figure 5:
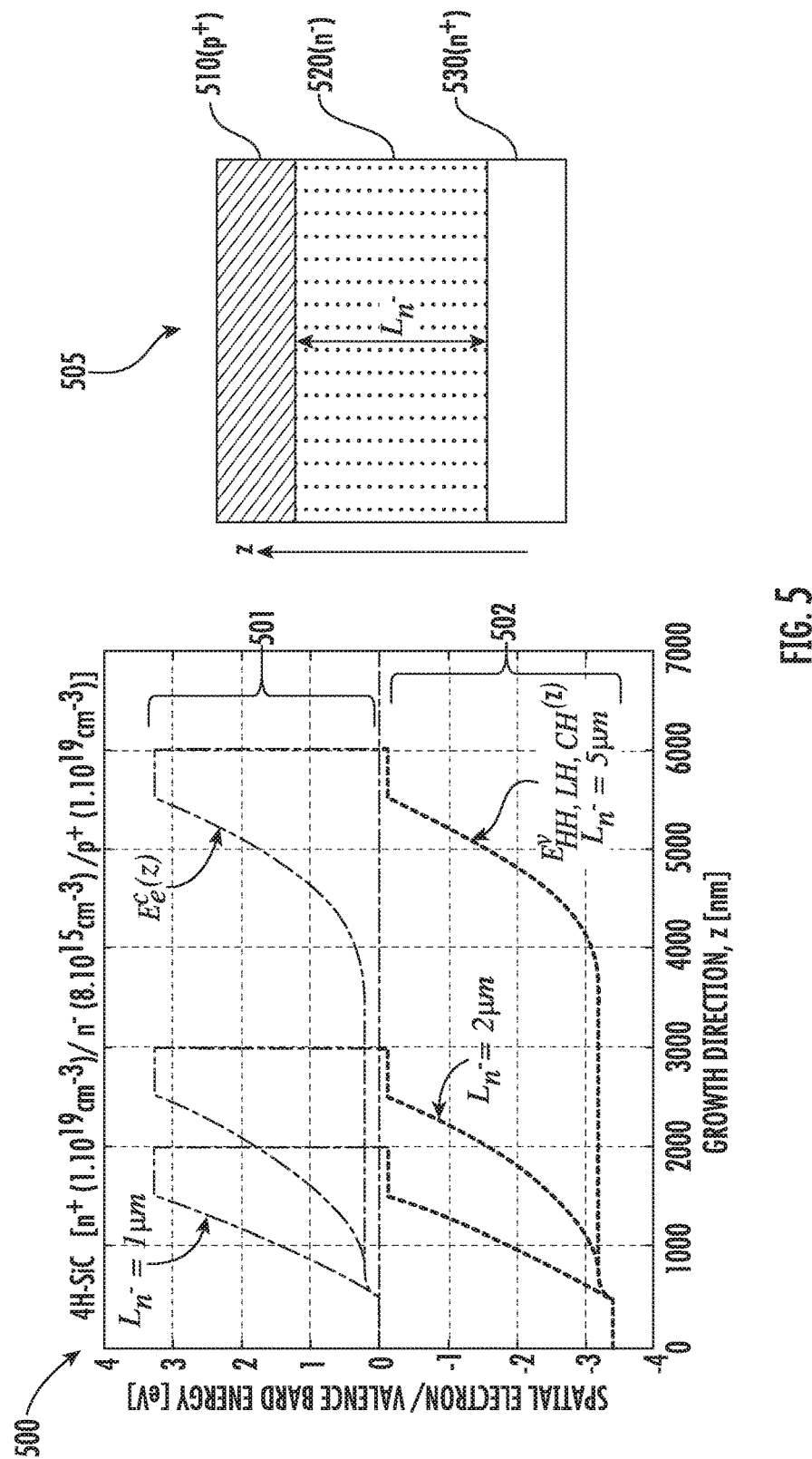
FIG. 5 is a graph of spatial energy band structure for and a cross-sectional view of an abrupt homojunction 4H—SiC diode, in accordance with some embodiments.

Graph 500 of FIG. 5 is a unique calculation of the full band structure of a diode, showing the depletion region of the band edges based on Schrödinger-Poisson equations. Graph 500 represents the spatial energy band structure and depletion layer for an abrupt homojunction 4H—SiC diode 505 at equilibrium. Diode 505 has an $n^+$ substrate layer 530, $n^-$ layer 520 and $p^+$ layer 510 to form an $n^+$-$n^-$-$p^+$ structure. The vertical direction z of the device is shown. The spatial variation of the conduction band (curves 501) and valence band (curves 502) are shown in graph 500 for the drift region lengths (layer thicknesses) having values of $L_n$=1, 2, and 5 µm for the $n^-$ drift (or blocking) layer 520. In this example configuration, the doped layers comprise: $N_{drift}^D=1\cdot10^{1s}$ cm$^{-3}$ (for layer 520), $N_{p+}^A=1\cdot10^{19}$ cm$^{-3}$ (for layer 510), $N_{n+}^D=1\cdot10^{19}$ cm$^{-3}$ (for layer 530).

Figure 6:
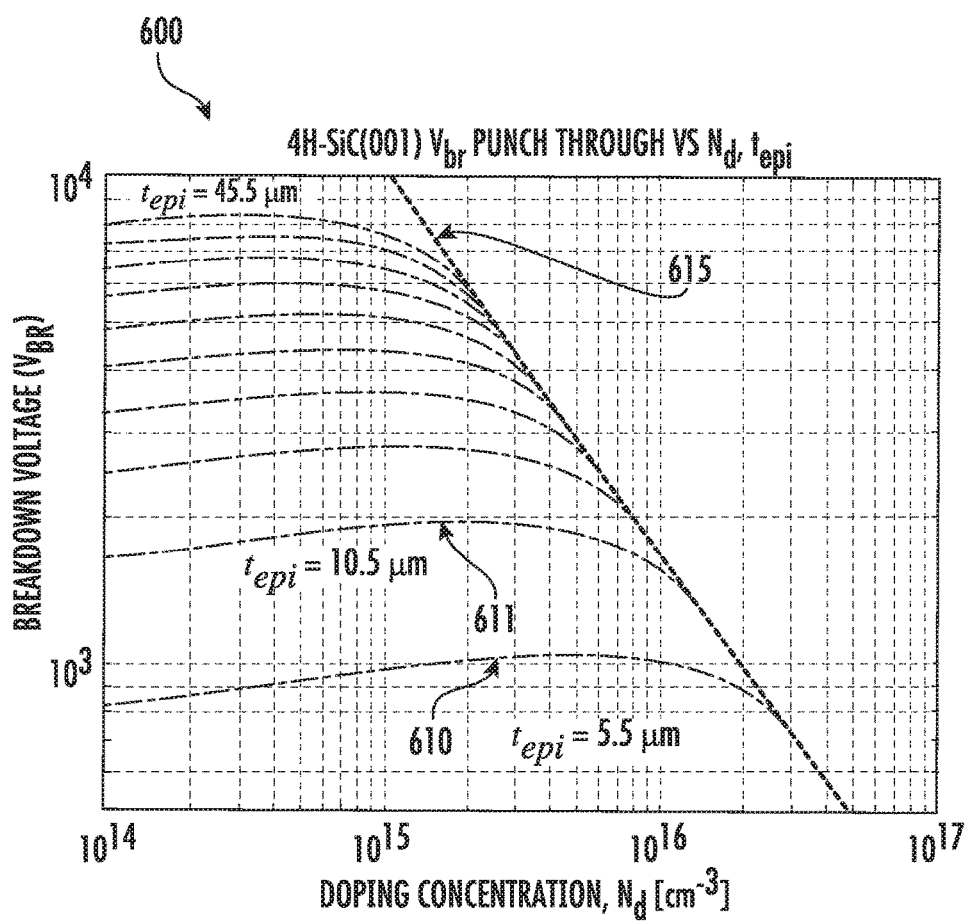
FIG. 6 shows curves for calculated ideal abrupt junction breakdown voltage versus material donor doping concentration, in accordance with some embodiments.

The graph 600 of FIG. 6 plots parametric curves (e.g., curves 610, 611) for the calculated ideal abrupt junction breakdown voltage versus material donor doping concentration ($V_{BR}$ vs. $N_D$) as well as a line 615 for the ideal abrupt case of punch-through for a given 4H—SiC epilayer thickness. Parametric curves are shown describing 4H—SiC properties with respect to the film thickness t_epi, donor concentration, and breakdown voltage capability. If the drift region thickness $L_n$ is smaller than the necessary depletion width required to support a given reverse bias, then a punch-through condition will occur. The point at which the ideal and punch-through curve (e.g., curve 610 for t_epi=5.5 µm) meet is the optimal thickness of 4H—SiC for a given doping and the resulting breakdown performance. For example, referring to the punch-through graph 600, curve 610 for a 4H—SiC slab of t_epi=5.5 µm is capable of blocking $V_{BR}$=1 kV for a donor-type doping density of $N_d=10^{16}$ cm$^{-3}$. The doping and thicknesses of a 4H—SiC film and substrate (i.e., epilayers and substrate on which the epilayers are formed) can be selected by referring to the curves of FIG. 6. For example, a doping concentration for the channel layer can be chosen and a different doping concentration chosen for the drift (breakdown) layer. In another embodiment, a doping concentration can be chosen to achieve an optimal thickness for a desired breakdown voltage. In yet another embodiment, a breakdown voltage can be set, and either i) the layer thickness can be determined from graph 600 based on a certain doping concentration, or ii) a doping concentration can be determined from graph 600 based on a certain layer thickness. The curves of graph 600 uniquely provide relationships between the parameters of layer thickness, doping concentration, and breakdown voltage.

The potential drop across the heavily doped n+ substrate 530 will be small and also have a low blocking voltage ability. It is therefore advantageous to minimize the thickness of the n+ substrate 530 to further reduce the total vertical resistance of the device 505. The point at which the ideal and punch-through curves intersect is taken as the optimal thickness of 4H—SiC slab (substrate and epilayers) for a given doping and the resulting breakdown/blocking performance.

Figure 7:
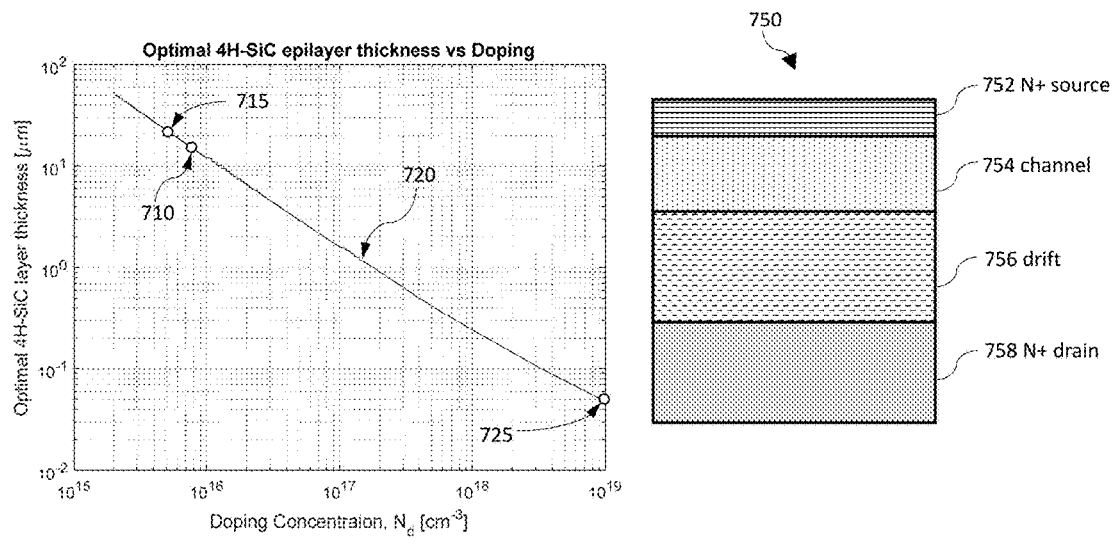
FIG. 7 shows calculated thicknesses for a given donor concentration and a cross-sectional view of a selected layers of a vertical switch, in accordance with some embodiments.

In the present embodiments, the curves of FIG. 6 are used to build the optimal thickness for a given thickness of 4H—SiC in order to support a given donor doping concentration. Curve 720 of FIG. 7 shows the variation of 4H—SiC film thickness necessary to optimally support the desired donor doping concentration $N_D$. The vertical switch layer stack 750 shown in FIG. 7 comprises two ohmic highly doped n+ regions: n+ source region 752 and n+ drain region 758 ($N_d=10^{19}$ cm$^{-3}$) which sandwich a channel layer 754 and a high voltage blocking drift layer 756. Drift layer 756 is between n+ drain region 758 and channel layer 754. The blocking drift layer 756 can be designed, for example, to have a breakdown voltage of $V_{BR}$=1.1 kV. Referring to graph 600 of FIG. 6, the y-axis value of $V_{BR}$=1.1 kV intersects parametric curve 611 such that the required doping density is $N_{drift}=8\times10^{15}$ cm$^{-3}$ for a layer thickness of t_epi=10.5 µm.

FIG. 7 shows the calculated optimal 4H—SiC thickness for a given donor concentration relating to the vertical switch regions. The calculated optimal thickness of the drift layer with $N_{drift}=8\times L\ 10^{15}$ cm$^{-3}$ is $L_{drift}$=10.5 µm, indicated by point 710. The channel layer is also selected from a low donor density doping which may be less than or equal to the drift layer. The voltage breakdown criteria of the device shown in FIG. 4 is therefore specified.

For a switching having gate control using junction field effect, a depletion region is modulated for OFF and ON states to allow current to flow vertically between the source and drain contacts of the device. Therefore, the device epilayer stack 750 on the 4H—SiC bulk n+ substrate that is modeled in the graphs of FIGS. 5 and 6 can be optimized for each donor doping concentration required for the vertical switch. For example, for a desired or specified breakdown voltage to be achieved, the graph of FIG. 6 can be used to find the optimal doping concentration for the drift region. Then, using the determined optimal doping concentration, FIG. 7 can be used to find the optimal thickness for the drift region. Since it is the drift region that primarily supports the breakdown voltage for the overall switch, designing the drift region to achieve the switch's breakdown specification enables other layers in the vertical switch to be thinner. In other words, by decoupling the channel region from the drift region, the channel region can be thinner than in conventional devices and thus gate capacitance is reduced. In the example of FIGS. 5-6, the drift region, requires an epi-layer thickness and doping as shown by the points 715 and 710 in FIG. 7. The n+4H—SiC substrate clearly only needs to have a relatively small thickness according to point 725 on the curve 720, and thus thicker substrate thicknesses beyond 725 only increase the vertical conduction of the switch unnecessarily.

Figure 8:
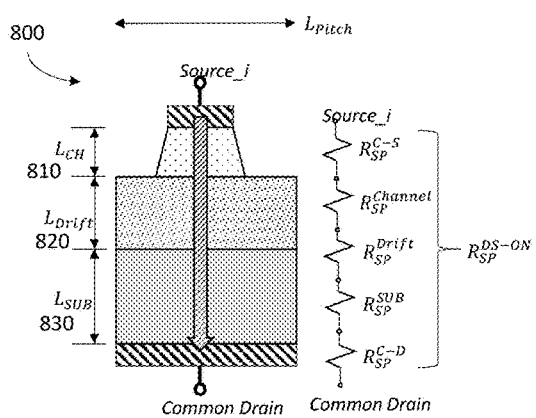
FIGS. 8 and 9 show component ON-state resistances for two vertical switches having different substrate thicknesses, in accordance with some embodiments.

The total ON-resistance $R_{DS-on}$ can be estimated by referring to FIG. 8 which decomposes the component resistances. The device 800 has a channel layer 810 with thickness $L_{CH}$, an n– 4H—SiC drift layer 820 with thickness $L_{Drift}$, and an n+4H—SiC substrate 830 with thickness $L_{SUB}$. The lateral width of the device 800 is $L_{PITCH}$. In terms of the specific resistances:

$$R_{SP}^{Total} = R_{SP}^{C-S} + R_{SP}^{channel} + R_{SP}^{Drift} + R_{SP}^{SUB} + R_{SP}^{C-D} \quad \text{(Eq. 1)}$$

The channel and drift layer resistances are the largest contributors where in an example embodiment (where q=charge):

$$R_{SP}^{Channel} = \frac{L_{CH}}{q\mu_n N_{D(channel)}} = 45.7 \ m\Omega \cdot cm^2 \quad (Eq. \ 2)$$

$$R_{SP}^{Drift} = \frac{L_{Drift}}{q\mu_n N_{D(drift)}} = 95.1 \ m\Omega \cdot cm^2 \quad (Eq. \ 3)$$

$$R_{SP}^{SUB} = \frac{L_{SUB}}{q\mu_n N_{D(sub)}} = 26.6 \ m\Omega \cdot cm^2 \quad (Eq. \ 4)$$

For the case of high quality 4H—SiC material the electron mobility $\mu_n$=820 cm$^2$/V·s, $L_{Channel}$=3 µm, $L_{Drift}$=10 µm, $L_{SUB}$=350 µm (for 150 mm diam. wafer), $N_{D(channel)}$=5×10$^{15}$ cm$^{-3}$, $N_{D(drift)}$=8×10$^{15}$ cm$^{-3}$, and, $N_{D(SUB)}$=1×10$^{18}$ cm$^{-3}$.

Assuming simple resistive heating, the channel region will potentially generate a large fraction of the ohmic heating in the ON-state. The high thermal conductivity of crystalline SiC is highly advantageous for dissipating thermal loads within the device and therefore SiC drift and substrate regions act as an integrated heatsink to spread thermal load. Similarly, dense source and gate metal electrode packing density facilitates dissipation of thermal loads. This is one of the major advantages for SiC materials in comparison to GaAs and Si wherein self-heating effects present significant limitations to power density.

It is noted that a seed portion of the 4H—SiC bulk substrate may contain a large number of disadvantageous crystalline imperfections (such as, micro-pipes and polytype inclusions). Therefore, the material region close to and containing the seed crystal may exhibit an electron mobility substantially inferior to the high crystal quality value quoted above. A physical vapor transport (PVT) growth method described later in this disclosure improves the 4H—SiC crystalline perfection as a function of the thickness of bulk material grown. Periodic modulation of the PVT growth conditions (typically using nitrogen) are also utilized for polytype control during PVT growth. In some embodiments, this seed portion of the bulk PVT substrate when removed from the final device stack can benefit in reducing the overall ON-resistance.

Figure 9:
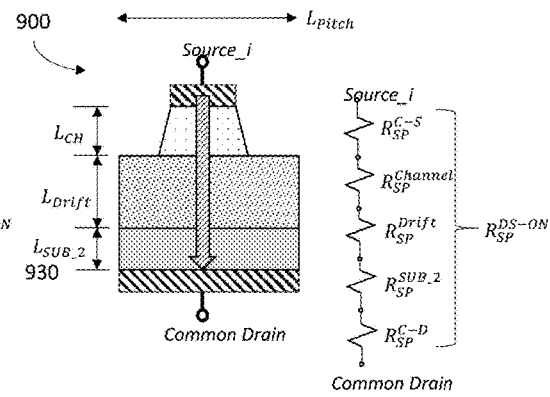

A comparison of FIG. 8 and FIG. 9 shows that in some embodiments, improvement in vertical switch ON-state resistance can be achieved by optimizing the thickness of the bulk n+ SiC substrate. Device 800 of FIG. 8 has a SiC substrate with a thickness 830 ($L_{SUB}$) on the order of 350 µm, where the contribution of the substrate to the ON-resistance is $$\frac{R_{SP}^{SUB}}{R_{SP}^{DS-ON}} \sim 30\%.$$

Device 900 of FIG. 9 has a thinner SiC substrate, where the thickness 930 ($L_{SUB\_2}$) is on the order of 50 µm. The thickness of $L_{SUB\_2}$ may be advantageously reduced because the breakdown voltage of the device 900 is largely controlled by the optimal thickness and doping concentration determined for the drift region $L_{Drift}$. Consequently, the contribution of the substrate to the ON-resistance in device 900 is reduced compared to device 800, resulting in an overall reduced ON-state resistance of the device 900 as compared to the device 800.

Thus, as discussed with reference to FIGS. 6-7, a total optimal thickness of the epitaxial drift layer measured along the vertical direction is advantageously selected to withstand a predetermined breakdown voltage without unduly increasing the device ON-resistance. In some embodiments, the breakdown voltage is achieved by selecting a drift layer thickness which ranges from 5.5 µm to 45.5 µm. The total thickness of the epitaxial drift layer has a total doping concentration relating inversely to the total thickness of the epitaxial drift layer. The total doping concentration may range from 1×10$^{15}$ cm$^{-3}$ to 2×10$^{16}$ cm$^{-3}$, such as from 7×10$^{15}$ cm$^{-3}$ to 9×10$^{15}$ cm$^{-3}$. The total thickness of the epitaxial drift layer may range from, for example, 10 µm to for a tightly controlled doping concentration within the bulk of the layer, or 10 µm to 100 µm for higher breakdown voltages.

Channel Control Region

The channel control region controls the vertical current flow in the device. It is well known that native oxides for SiC are challenging to manufacture for low leakage, low interfacial trap density and high reliability. Therefore, metal-oxide-semiconductor (MOS) field-effect channel control, while possible, presents technical challenges and thus increased cost. In the present embodiments, a junction field-effect is selected for controlling the channel.

Figures 10A, 10B:
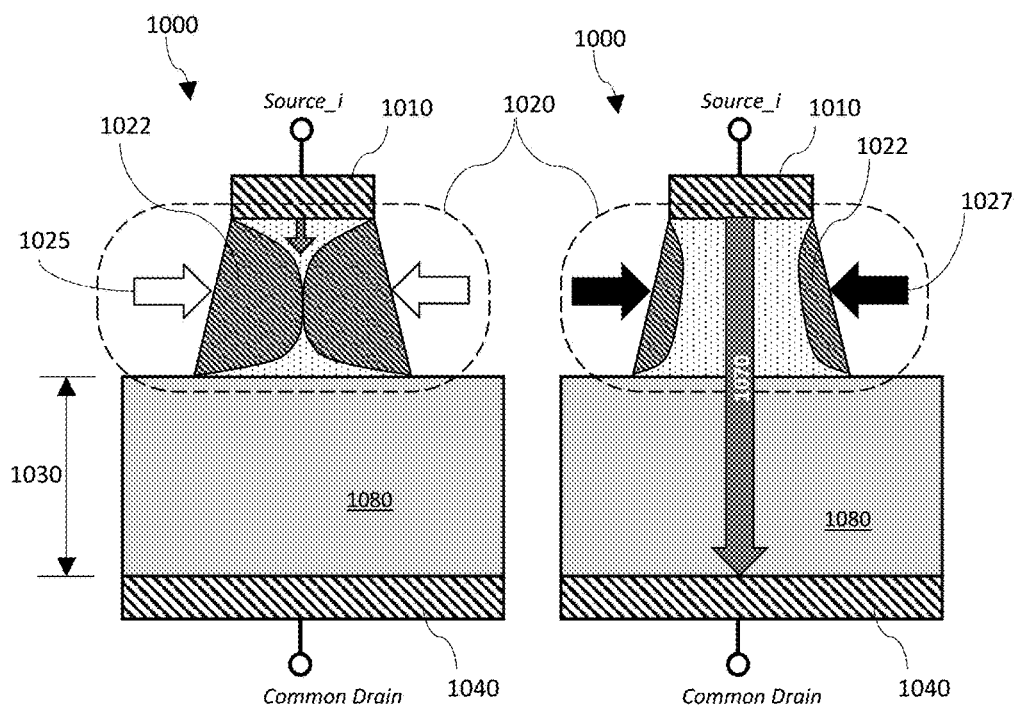
FIGS. 10A-10B are vertical cross-sections showing general function of a 3-terminal vertical switch, in accordance with some embodiments.

The general function of a 3-terminal vertical switch of the present embodiments is schematically shown in FIGS. 10A-10B. The device 1000 is partitioned functionally into channel control region 1020 and breakdown voltage control region 1030. Device 1000 is shown as OFF in FIG. 10A (channel control state 1025=0, where current flow is blocked) and as ON in FIG. 10B (channel control state 1027=1, where current is conductive). That is, FIG. 10A shows the device 1000 in a blocking state 1025 where vertical conduction current flow is inhibited by the depletion fields 1022 in the channel control region 1020. Conversely, in the switch conduction state 1027 the depletion fields 1022 are smaller than in FIG. 10A, allowing vertical current to flow between the source 1010 and drain 1040 as indicated by arrow 1070. Breakdown voltage control is achieved in region 1030 by configuration of material properties in the 4H—SiC substrate structure 1080 which is depicted as a SiC block. The 4H—SiC substrate structure 1080 includes a backside substrate and additional epilayers such as a drift layer, where these individual layers are not shown for clarity.

Figures 11A, 11B:
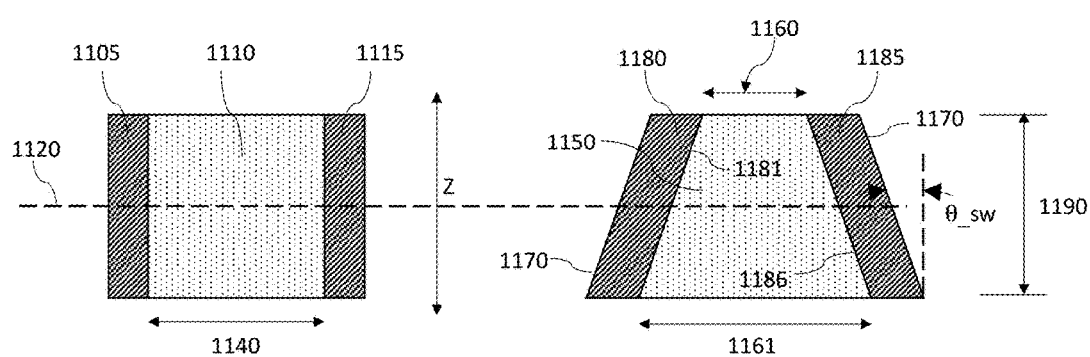
FIG. 11A is a cross-sectional shape of a conventional channel control region.
FIG. 11B is a cross-sectional shape of a channel control region, in accordance with some embodiments.
Figure 12A:
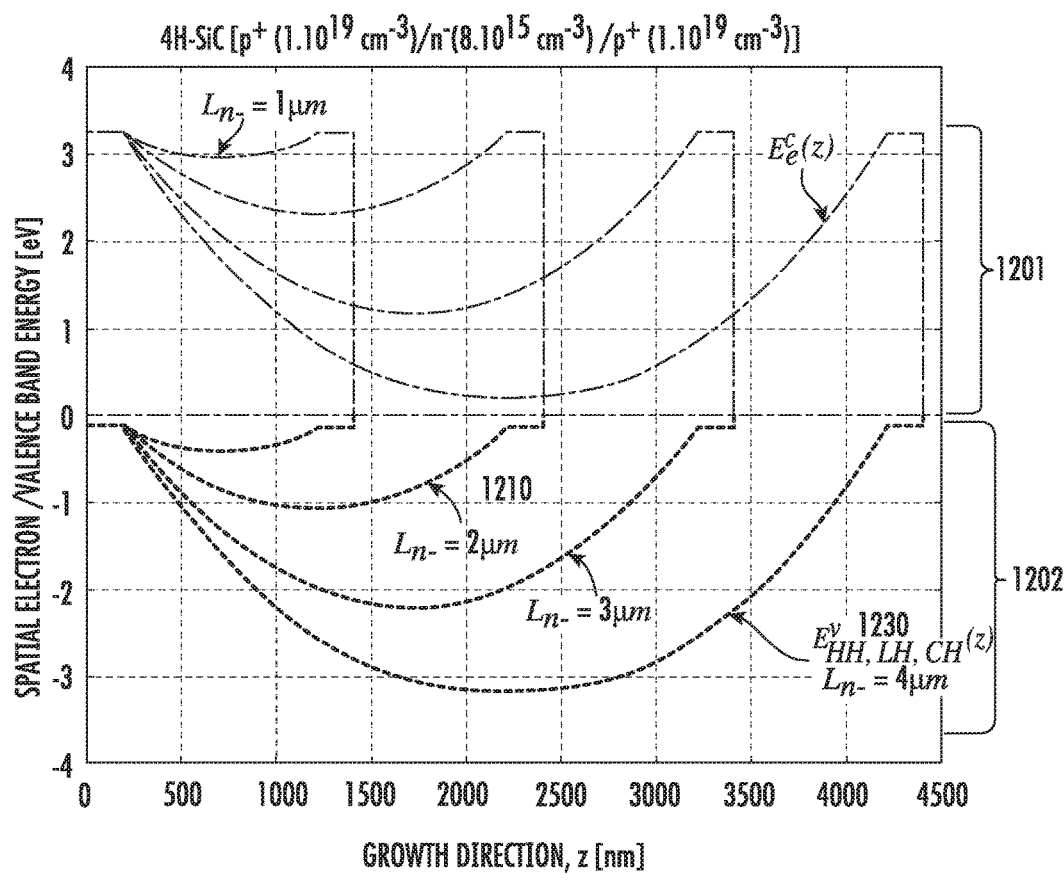
FIG. 12A is a graph of spatial energy band structures taken along horizontal slices of a channel region, in accordance with some embodiments.

The cross-sectional shape of the channel control region in the present embodiments is selected for the unique properties afforded for both device operation and device manufacture. FIG. 11A shows a conventional channel control region 1110 having a rectangular cross-section. If opposite conductivity type materials are used to form a symmetric homo-junction, where p+ regions 1105 and 1115 are gate regions that sandwich the uniform n⁻ channel control region 1110 of width 1140, then the depletion potential energy field spatially along the horizontal axis 1120 would be as shown in a particular curve in FIG. 12A that corresponds to the particular channel width $L_{n^-}$. Depending upon the doping concentrations of the p+ and n− region and the width of channel region, the conduction (curves 1201) and valence band (curves 1202) spatial variation would be as shown in FIG. 12A. For example, a constant channel width 1140 of $L_{n^-}$=2 µm, would have a spatial energy band structure as shown in curve 1210 of FIG. 12A and would be the same for any horizontal slice taken anywhere on the vertical axis Z.

Conversely, a trapezoidal channel region shown 1150 in the vertical cross-section of FIG. 11B has a top width 1160 that is less than the bottom width 1161 such that channel control region 1150 tapers upward. Sidewalls 1170 have an angle θ_sw measured relative to the vertical direction Z that may range from 2 degrees to 30 degrees, such as from 15 degrees to 30 degrees. In some embodiments, the angled sidewalls 1170 can be convex or concave along their length, rather than the linear walls shown in FIG. 11B. Sidewalls 1170 may represent opposite walls of a transistor device having a rectangular cross-section in the horizontal plane (e.g., the unit cell shown in FIG. 2), or may be a single sidewall of a transistor device having a circular cross-section in the horizontal plane (i.e., where the channel control region 1150 is frusto-conical). Gate regions 1180 and 1185 are p+ regions are formed in the sidewalls 1170, where inner boundaries 1181 and 1186 of gate regions 1180 and 1185, respectively, are parallel to the sidewalls 1170.

As shown in FIG. 12A, the spatial energy band structure of the channel region for various horizontal slices taken along the vertical axis Z would attain a continuous variation of potential energy profiles. For example, near the top width 1160 of $L_n$=2 μm the channel region would have a spatial energy band structure as shown in curve 1210 of FIG. 12A, while near the bottom channel width 1161 of $L_n$=4 μm the channel region would have a spatial energy band structure as shown in curve 1230 of FIG. 12A. The electronic function of trapezoidal channel region 1150 compared to the conventional rectangular channel region 1110 is therefore clearly different and has direct implication for the potential operation of the vertical conduction switch comprising separate channel control and breakdown voltage regions. In some embodiments, the top width 1160 of channel region 1150 may be less than or equal to 3.5 μm, such as less than or equal to 1.5 μm, where a thickness 1190 (i.e., channel length $L_{CH}$ in FIG. 8) in the vertical direction Z ranges from 1 μm to 5 μm.

Figure 12B:
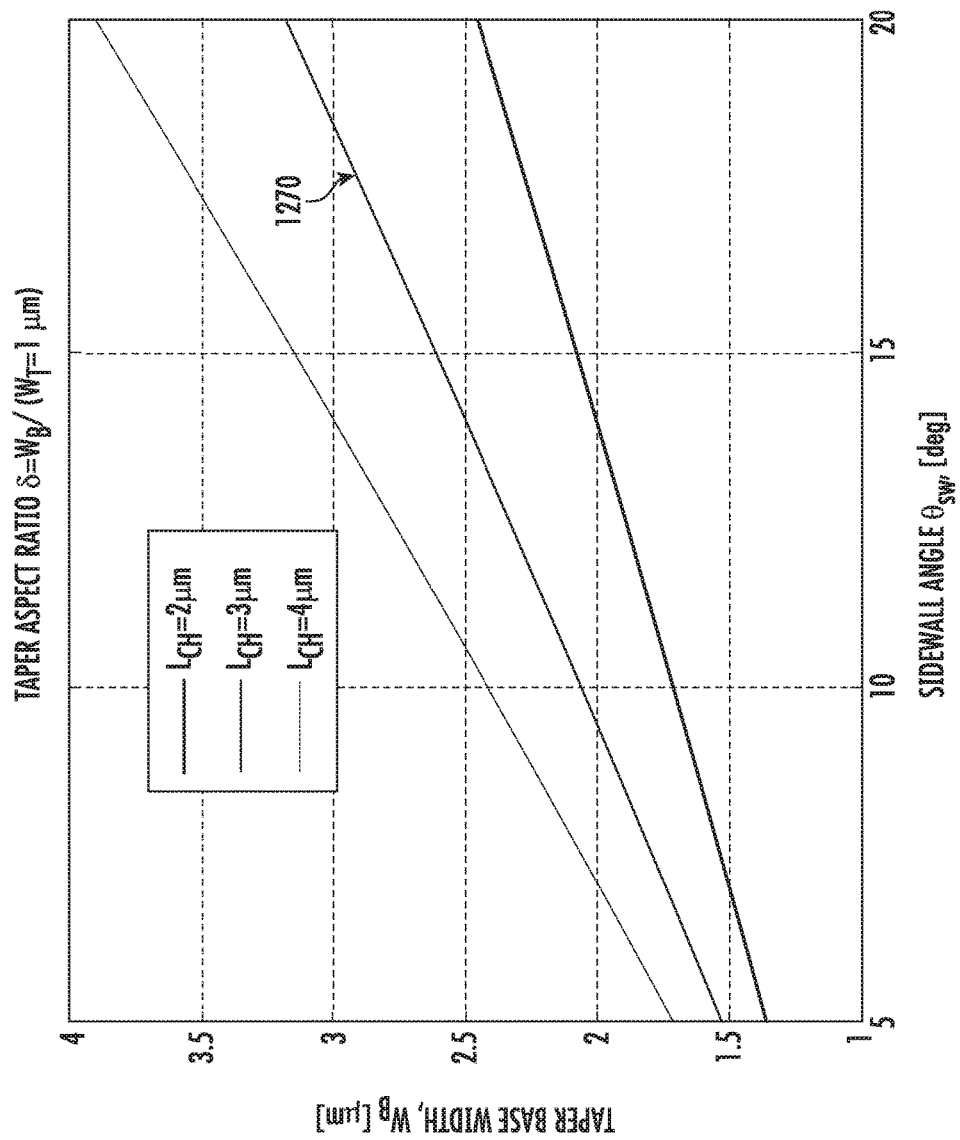
FIG. 12B is a graph of various geometries for trapezoidal channel control regions, in accordance with some embodiments.

FIG. 12B shows possible variations in construction geometry for the trapezoidal channel control region 1150, having channel length 1190, a sidewall slope angle $\theta_{SW}$, top channel width $W_T$ 1160 and bottom channel width (taper base width) $w_B$ 1161. FIG. 12B shows the bottom width of the channel region required for a given top channel width for various sidewall slope angles, where the angle is respect to the vertical axis (i.e., growth direction) of the device stack. The graph of FIG. 12B calculates the variation in the bottom channel width 1161 as a function of a preselected sidewall slope $\theta_{SW}$, for embodiments of various channel lengths 1190 ranging from 2≤$L_{CH}$≤4 μm, and a top channel width 1160 of $w_T$=1 μm. For narrow top channel widths of the gate (defined by lithography processes) such as $w_T$=1 μm in FIG. 12B, the sidewall slope angle is typically a technology factor determined by etch processes. For a given process the resulting sidewall slope, which can also be engineered, results in a basal width of the channel trapezoid.

Figure 13:
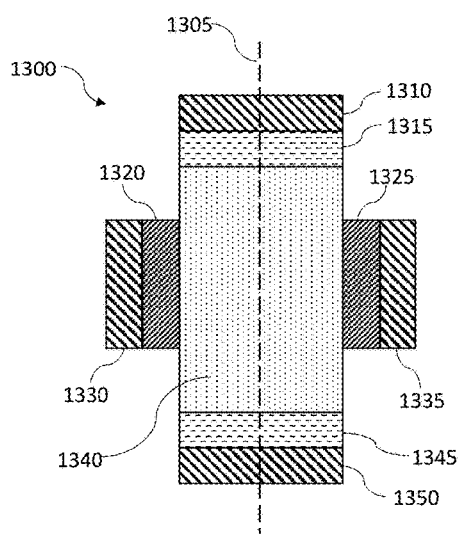
FIG. 13 is a vertical cross-section of a conventional junction field effect device.
Figure 14:
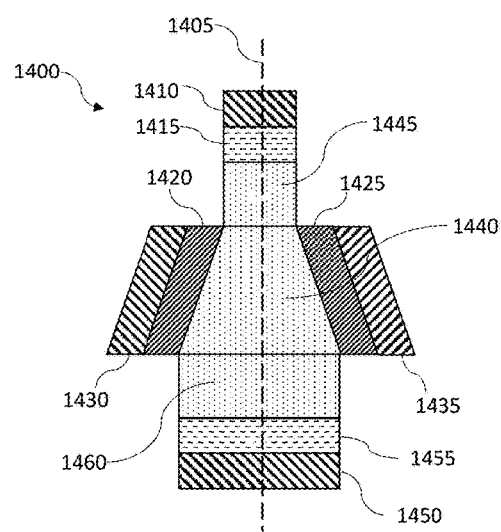
FIG. 14 is a vertical cross-section of a junction field effect device having a trapezoidal channel region, in accordance with some embodiments.

In view of the above discussion, switch configurations incorporating a junction field effect (JFE) to control the depletion and potential energy barrier between the source and drain are described by FIGS. 13 and 14. A conventional JFE device 1300 with uniform width channel region 1340 is shown in FIG. 13. The source electrode 1310 and drain electrode 1350 are contacted by source and drain ohmic semiconductor layers 1315 and 1345, respectively. In some embodiments, ohmic semiconductor layers 1315 and 1345 are high doped donor $n^+$ semiconductor material. A portion of the lightly donor doped $n^-$ channel region 1340 is contacted by high acceptor doping $p^+$ gate regions 1320 and 1325. The device operation is symmetric in the mirror axis 1305. The gate electrodes 1330 and 1335 are held at the same potential and thus form a depletion region between gate regions 1320 and 1325 that can be controlled by a voltage difference between the gate 1320 and source electrode 1310. If a large electron potential energy exists between the source electrode 1310 and drain electrode 1350 then electron flow vertically will be inhibited. This can be achieved by the lateral $p^+$-$n^-$-$p^+$ and vertical $p^+$-$n^-$-$n^+$ depletion fields setup between the source electrode 1310, channel region 1340 and gate regions 1320 and 1325.

FIG. 14 shows a 3-terminal JFE vertical conductor transistor device 1400, in accordance with some embodiments. Device 1400 is similar to device 1300 but has a distinguishing feature of trapezoidal channel region 1440 sandwiched by $p^+$ gate regions 1420 and 1425 along with the respective gate electrodes 1430 and 1435. Additionally, the channel control region 1440 is of a different thickness and doping concentration than the drift layer 1460 which is between channel control region 1440 and the drain 1450. The source 1410 and drain 1450 contact the channel regions 1440 and 1445 and the drift layer 1460 via highly donor doped $n^+$ source layer 1415 and drain layer 1455.

Referring now to FIGS. 15 and 16, the differentiating operation for the conventional device type 1300 and present device type 1400 is clearly shown. The JFE devices 1300 and 1400 in FIGS. 15 and 16 exhibit substantially different spatial depletion regions 1390 and 1490, respectively, in the channel for reverse-biased gate-to-source voltages. The depletion regions 1390 and 1490 extend into a majority of the channel and form a large electron energy potential, thereby inhibiting current flow between the source and drain. For the constant-width channel region 1340 of FIG. 16, the depletion region 1390 is shown to pinch-off near the channel-drain spatial region when there is a potential difference across between the source electrode 1310 and drain electrode 1350, where the drain electrode 1350 is at a larger positive potential than the source electrode 1310. The depletion region pinch-off region 1395 is non-uniform within the channel, becoming particularly narrow in pinch-off area 1395, and can be a source of high field strength stress under large blocking voltages. In contrast, the non-uniform width, trapezoidal channel control region 1440 of the device 1400 exhibits a more uniform depletion region 1490 within the channel control region 1440 and a more uniform-width pinch-off region. Thus, the angled sidewall, trapezoidal channel control region 1440 for the JFE device 1400 is advantageous for high breakdown voltage operation switching devices. The non-uniform channel geometry does have a trade-off in performance by reducing the source pad area, consequently resulting in reduced vertical current density relative to a similarly sized uniform (constant width) channel device. Thus, the tapered channel configuration of the present disclosure may be counter-intuitive as a design choice.

Figure 17:
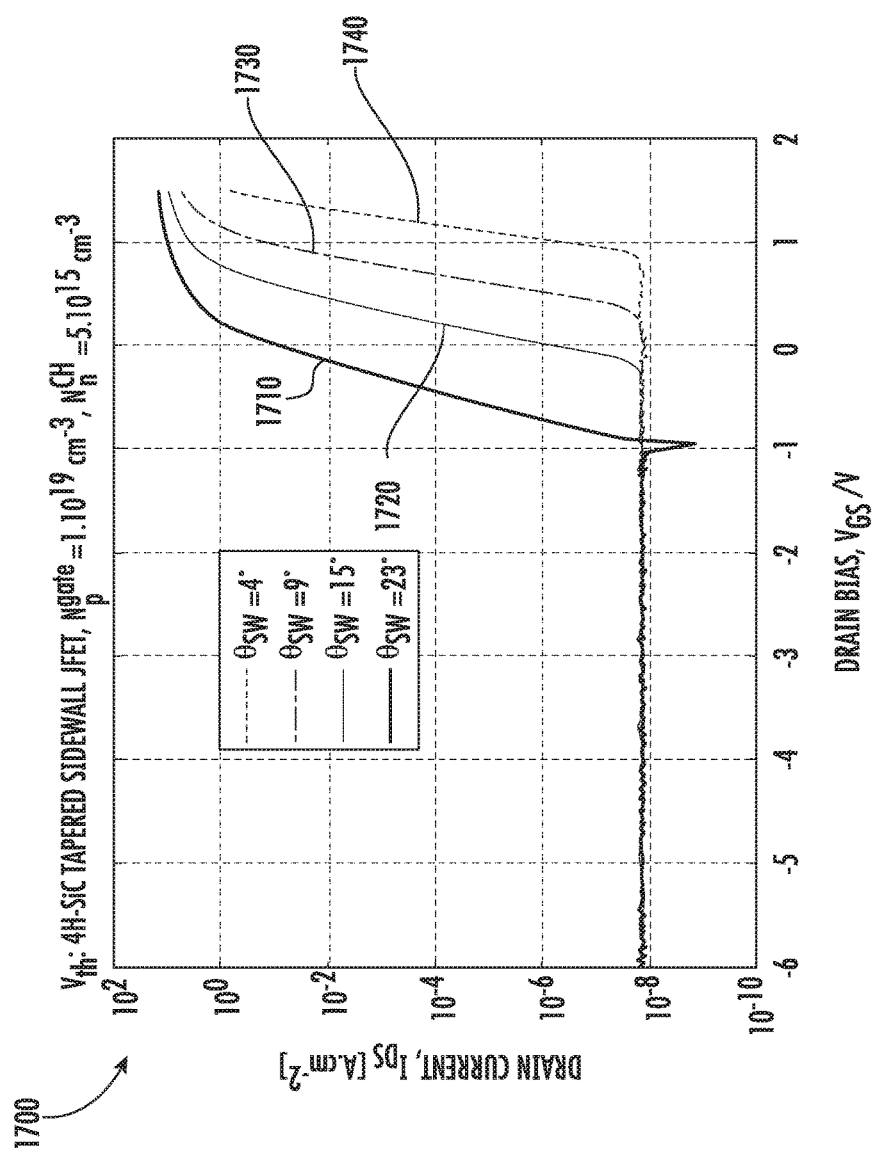
FIG. 17 is a graph of drain current versus drain bias for different sidewall angles, in accordance with some embodiments.

An important aspect of the present devices is the influence of the sidewall slope on the operation of the channel region controlling the vertical conduction current of the device. FIG. 17 shows the effect of various sidewall slope angles on the channel region for the case of all other technology parameters being fixed. A tabulated technology parameter for the sidewall slope of the channel region and the resulting gate threshold voltage determining normally-ON and normally-OFF operating modes is summarized in graph 1700 of FIG. 17. FIG. 1700 shows drain current $I_{DS}$ as a function of drain bias $V_{GS}$ for different sidewall angles $\theta_{SW}$. Curve 1710 is for $\theta_{SW}$=4°, curve 1720 is for $\theta_{SW}$=9°, curve 1730 is for $\theta_{SW}$=15°, and curve 1740 is for $\theta_{SW}$=23°. Graph 1700 demonstrates that the sidewall angle can be chosen to select normally-ON or normally-OFF operating modes of the device. Clearly, the sidewall slope can be used to tune the operating mode of the switch from normally-ON 1710 to normally-OFF 1740 by inspecting the threshold voltage of the $I_{DS}$-vs-$V_{GS}$ characteristic.

Figure 18:
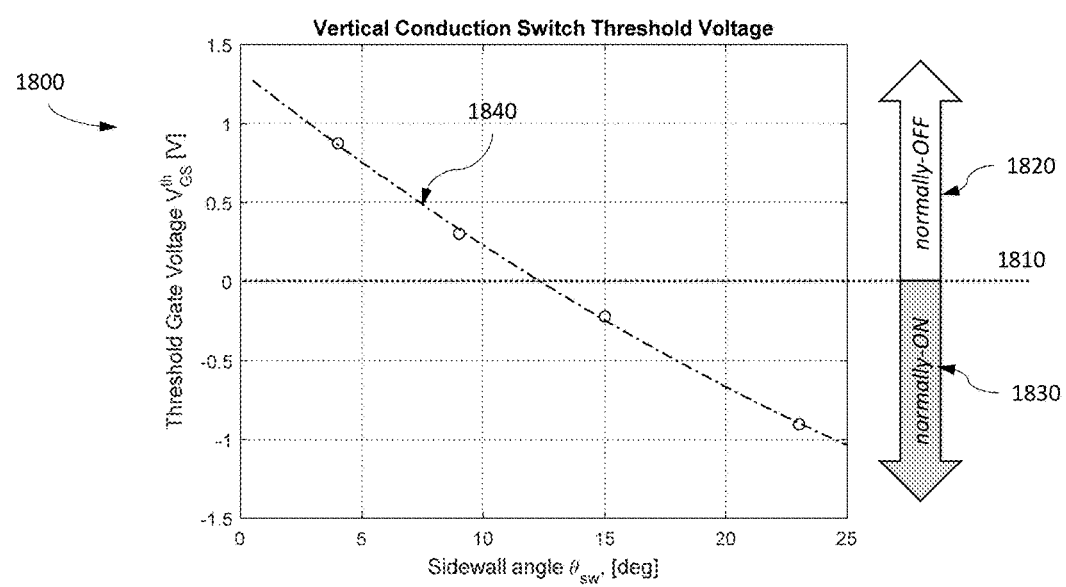
FIG. 18 is a graph of gate threshold voltage as a function of sidewall slope, in accordance with some embodiments.

Graph 1800 of FIG. 18 shows gate threshold voltage $V_{GS}$ of the vertical conduction 3-terminal 4H—SiC switch of the present disclosure as a function of the gate control region geometry, specifically the tapered sidewall slope. The transition boundary 1810 from normally-ON 1820 to normally-OFF 1830 operation is shown. The channel minimum width $W_T$ was 1.4 µm using 200 nm p+ implant depth 2175 (see FIG. 21), and $N_{channel}$=5×10$^{15}$ cm$^{-3}$ and $L_{CH}$=3 µm. Curve 1840, again, demonstrates that the sidewall angle can be chosen to select normally-ON or normally-OFF operating modes of the device.

Figure 19:
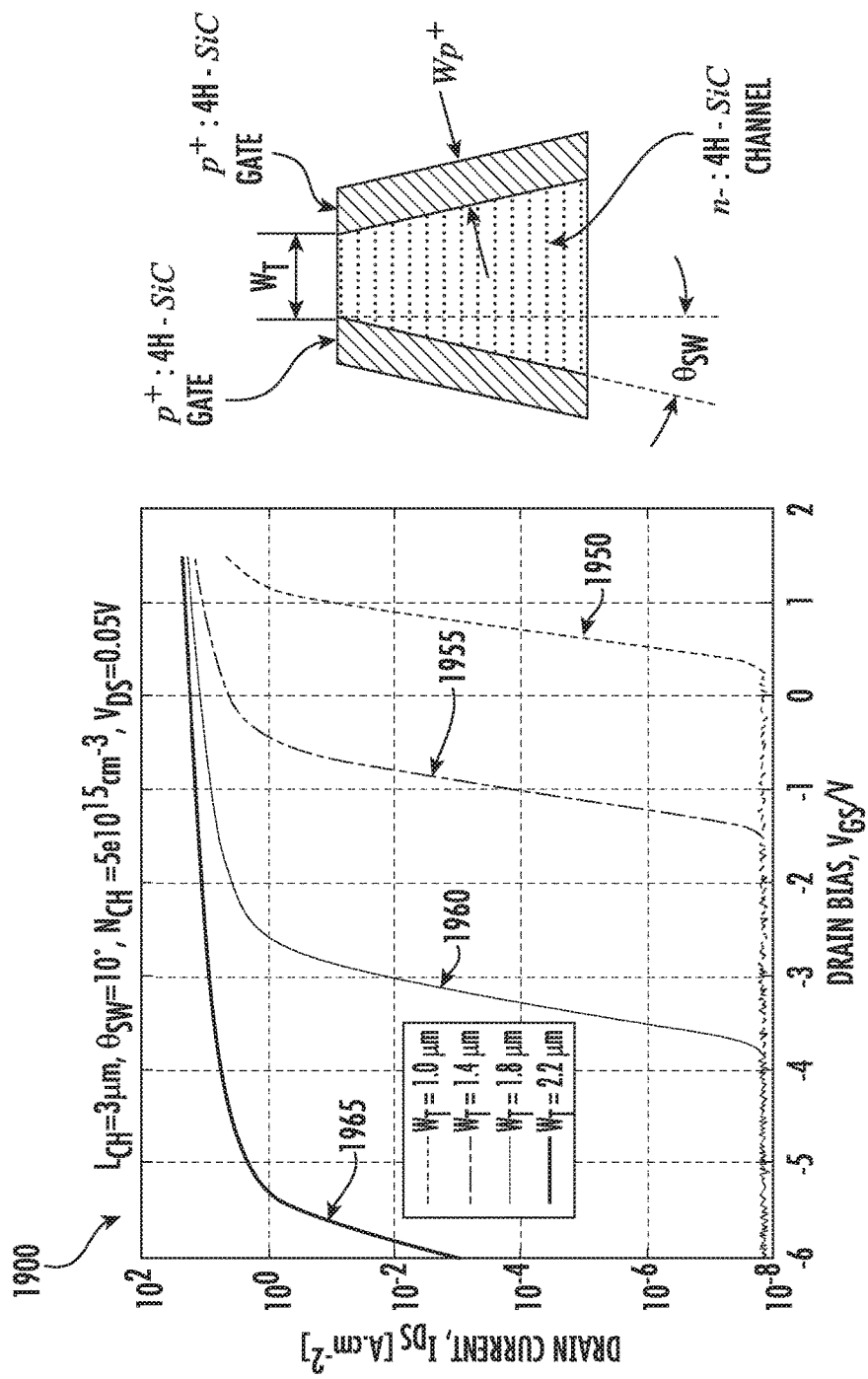
FIG. 19 is a graph of gate threshold voltage as a function of channel width, and a cross-sectional view of a trapezoidal channel control region, in accordance with some embodiments.

FIG. 19 demonstrates that for a given fabrication process for the formation of a SiC sidewall slope profile, there is yet a further design selection that can be used to tune the operating mode of the device. Graph 1900 of FIG. 19 illustrates a gate threshold voltage $V_{GS}$ of the present vertical conduction 3-terminal 4H—SiC switch as a function of the gate control region geometry, specifically the channel width for a fixed tapered sidewall slope. The n– channel width varied from 1.0≤$w_T$≤2.2 µm (value of $w_T$=1.0 µm for curve 1950, $w_T$=1.4 µm for curve 1955, $w_T$=1.8 µm for curve 1960, and $w_T$=2.2 µm for curve 1965) using a 200 nm p+ implant depth 2175 (see FIG. 21), and $N_{channel}$=5×10$^{15}$ cm$^{-3}$ and $L_{CH}$=3 µM. For the case of fixed sidewall slope the channel width $w_T$ can be varied to control the device threshold form normally-ON curve 1960 to normally-OFF curve 1950 operating modes as shown in FIG. 19.

Device Construction

The channel formation process shall now be discussed with explicit description of forming the angled sidewall that creates the tapered width of the trapezoidal channel control region.

Figure 20A:
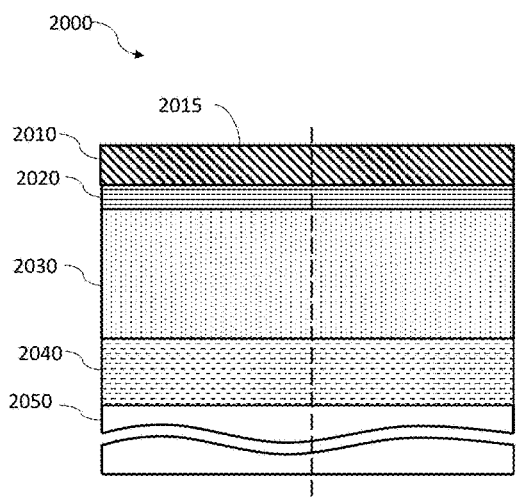
FIGS. 20A-20D are vertical cross-sections of device layer stacks during fabrication of a vertical conduction junction transistor, in accordance with some embodiments.

FIGS. 20A-20D disclose the general processing steps and geometry used to create a 3-terminal 4H—SiC semiconductor switch with a tapered channel control region. FIG. 20A is a cross-section of example 4H—SiC epilayers disposed upon a bulk substrate used to form the vertical switch. In some embodiments, a polytope of SiC other than 4H is used (e.g., 6H—SiC). The layers and region have a first conductivity type distinct in each region. FIG. 20A shows a 4H—SiC article 2000 formed comprising a bulk single crystal 4H—SiC (0001)-oriented substrate 2050. At least one precisely grown epilayer(s) 2040 and 2030 of 4H polytype is then preferentially disposed upon the substrate 2050. Silicon carbide is a challenging material to form in high crystalline quality with low defect density and large area substrates due primarily to the high temperature of formation and the specific chemistry of Si—C. Moreover, Si and C can form many polytopes, one of which is 4H—SiC. Although high crystal quality comprising structural quality and single polytope crystal in large area substrates has been demonstrated in the art by the use of PVT, a disadvantage of PVT remains—which is the comparatively slow growth rate compared to bulk Si growth techniques. PVT of SiC relies on a sublimation process using very high temperature of source materials comprising SiC powders or granules. The sublimation of the source material is then directed toward a seed crystal of the desired polytope of SiC. The energy costs and slow formation process of PVT SiC is one of the major contributors to the high cost per wafer for 4H—SiC. Therefore, any device formation processes for a switch made with a PVT SiC substrate will be impacted by the initial high substrate cost. In the present embodiments the substrate thickness can be reduced by having separate drift and channel layers with distinct characteristics, where the drift layer is used to control the breakdown voltage of the device.

Epilayer 2030 can be an ion-implanted region, such as N+, BF$_2$+, As, Al+ and the like. An ohmic semiconductor layer 2020 comprising yet another doping concentration and thickness is disposed upon the epilayer 2030. A metal contact layer 2010 (i.e., electrode layer) can also be disposed initially upon the article 2000 in some embodiments, or can be deposited in a later stage of the manufacturing process in other embodiments. The surface 2015 of contact layer 2010 is then patterned by a lithographic etching process as shown in FIG. 20B.

Figure 20B:
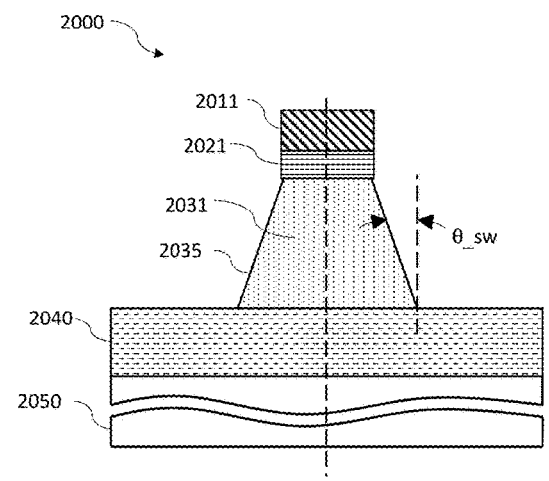

FIG. 20B is a cross-section of the 4H—SiC epi-layers disposed upon bulk substrate 2050 which are selectively patterned to form a trapezoidal channel control region 2031. The exposed sidewalls 2035 of the underlying epilayer 2030 or epilayers 2010 and 2020 (from which source regions 2011 and 2021, respectively, are formed) is created with a predetermined sidewall slope 2035. The physical etch depth can be limited to etching through layers 2010, 2020 and 2030 or there may be deeper etch depth extending into a portion of epilayer 2040. In general, etching through the entire epilayer 2040 is not preferred as this layer serves as the drift/blocking layer.

Figures 20C, 20D:
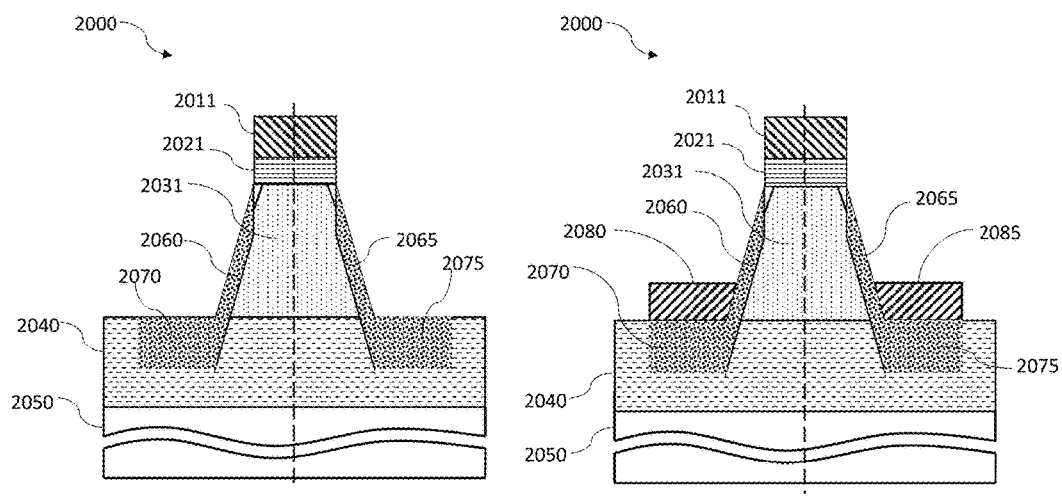

Next a spatial modification of conductivity type and or composition is formed as shown in FIG. 20C. FIG. 20C is a cross-section of the 4H—SiC article 2000 with epi-layers subsequently transforming a selectively spatial region to at least one different conductivity type and/or carrier concentration. The gate regions 2060 and 2065 are conductivity modified regions representing the p$^+$ gate region formation in the exposed sidewalls. The conductivity modified regions 2070 and 2075 in the epilayer 2040 represent optional regions for forming extended gate regions. As will be shown later, the conductivity modified regions 2070 and 2075 can be reduced in lateral extent to aid in high packing density of channel regions.

The conductivity modified regions 2060, 2065, 2070 and 2075 may be formed via near normal incidence ion implantation technique, which is an advantage of the disclosed embodiments as shall be described in more detail later in this disclosure. Implantation ion species, such as N+, BF$_2$+, As+, Al+ and the like, are all possible. Multiple ion implantation sequences (namely, species, energy and doses) can be utilized for achieving a plurality of depths and conductivity types.

Next, FIG. 20D shows the gate electrodes 2080 and 2085 formed to contact the gate regions 2070 and 2075. Gate electrodes 2080 and 2085 may or may not completely extend up along the entirety of the exposed sidewall including the p$^+$ gate regions 2060 and 2065. Gate electrodes 2080 and 2085 are electrical contacts formed to the distinct gate regions 2060 and 2065 forming the gate control region.

Figure 21:
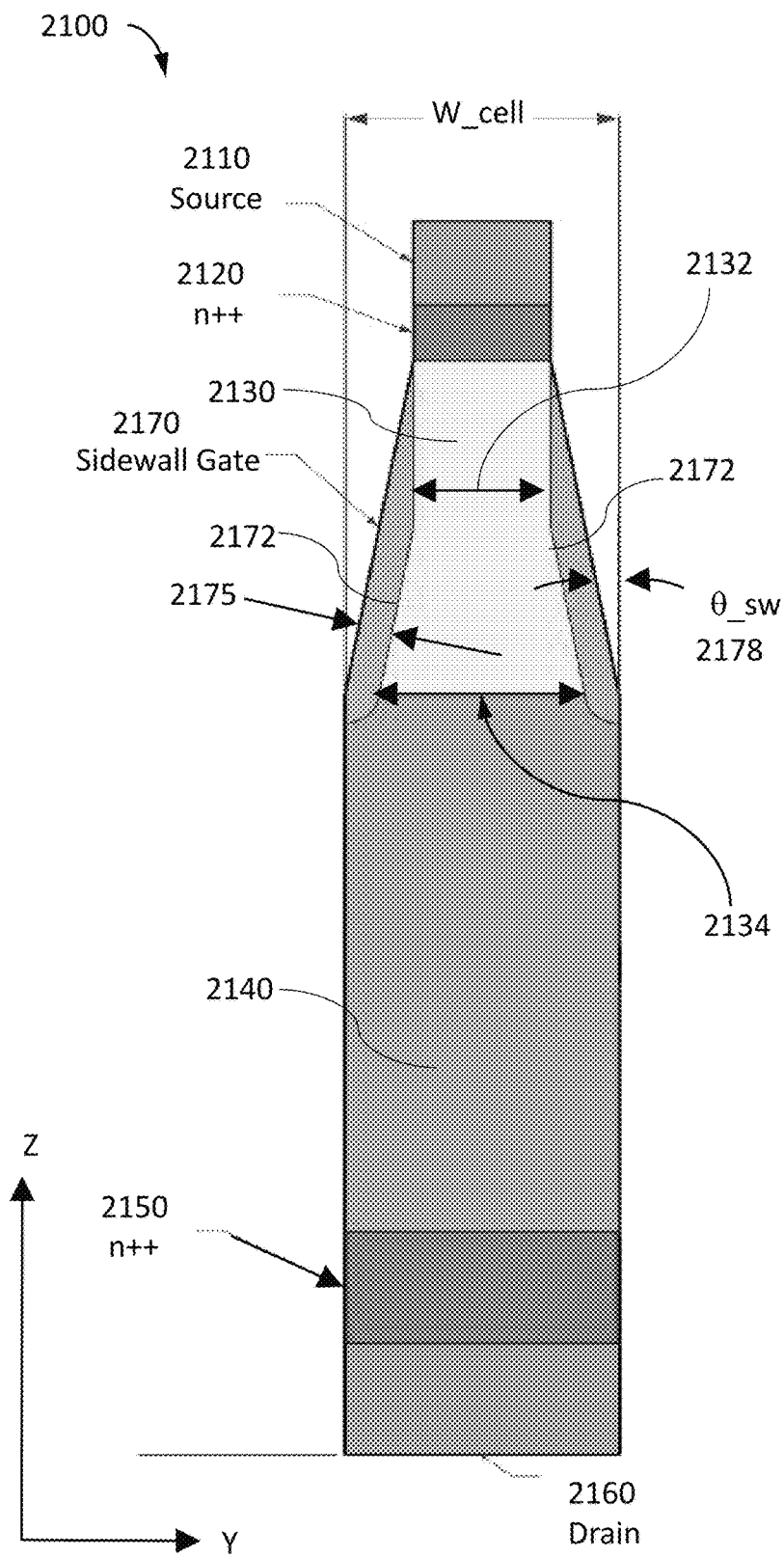
FIG. 21 is a vertical cross-section of a unit cell of a vertical switch, in accordance with some embodiments.

FIG. 21 is a two-dimensional cross-section of a unit cell of a 3-terminal switch 2100 implemented in 4H—SiC, further describing important features of the construction. The cross-section of FIG. 21 section represents a unit cell of the switch, showing the distinct spatial regions. Switch 2100 includes a source electrode 2110, a source ohmic region 2120, a channel control region 2130, a drift layer 2140, a substrate which can include a drain ohmic layer 2150, and a drain electrode 2160. Gate regions 2170 are formed in the sidewalls of channel control region 2130. The channel control region 2130 comprises the trapezoidal region having a minimum width 2132 at a top surface of the channel control region and maximum width 2134 at a bottom surface of the channel control region, and is bounded by inner boundaries 2172 of the gate regions 2170. The gate regions 2170 have a penetration depth 2175 into the channel. The sidewall slope 2178 and a substantially normal incidence ion-implantation of Al+ ions can be used to form the p$^+$ gate regions 2170. In this embodiment, penetration depth 2175 of gate regions 2170 is uniform for a majority of their length, and tapers in the upper portion of the channel control region 2130 toward the source 2110. In this embodiment, the outer sidewalls of the gate regions 2170 are shown to be linear but may be concave or convex in other embodiments.

In embodiments generally represented by FIG. 21, a multilayered semiconductor unit cell of a vertical conduction junction transistor includes a silicon carbide (SiC) substrate, where a vertical direction of the multilayered semiconductor unit cell is perpendicular to a top surface of the substrate; an epitaxial drift layer 2140 comprising SiC is formed on the top surface of the substrate; and an epitaxial channel layer (e.g., layer 2030 of FIG. 20A) comprising SiC is formed on a top surface of the epitaxial drift layer. In some embodiments, the drain ohmic layer 2150 (i.e., drain layer) is formed in or on a substrate and an epitaxial source ohmic layer 2120 comprising SiC is formed on a top surface of the epitaxial channel layer. In some embodiments, the substrate is a bulk single crystal 4H—SiC substrate; the epitaxial drift layer is a single-crystal 4H—SiC film; the epitaxial channel layer is a single-crystal 4H—SiC film; and the epitaxial source layer is a single-crystal 4H—SiC film. In some embodiments, the substrate is a bulk, single crystal, 4H—SiC, (0001) oriented substrate. In some embodiments, the substrate is a bulk, single crystal, 4H—SiC, carbon-face (000-1) oriented surface or a Si-face (0001) oriented substrate prior to deposition of epitaxial layers.

The epitaxial channel layer is tapered in the vertical direction, where a sidewall (e.g., sidewall 2035 of FIG. 20B) of the epitaxial channel layer is at an angle to the vertical direction. In some embodiments, an angle of the sidewall measured relative to the vertical direction ranges from 2 degrees to 30 degrees. In some embodiments, a first width of the channel control region at the top surface of the epitaxial channel layer is less than a second width of the channel control region at a bottom surface of the epitaxial channel layer.

A gate region 2170 is formed in the sidewall of the epitaxial channel layer, the gate region having an inner gate region boundary 2172 that is parallel to the sidewall. A channel control region 2130 is in the epitaxial channel layer, the channel control region having a width bounded by the inner gate region boundary 2172 and having a trapezoidal cross-section in a plane taken in the vertical direction. A cross-section of a region that includes the gate region and the channel control region in the plane perpendicular to the top surface of the epitaxial drift layer forms a trapezoidal three-region homojunction, the gate region being symmetric about a central reference line of the channel control region, the central reference line being orthogonal to the top surface of the epitaxial drift layer. A substantially uniform depletion region is formed along a central reference line of the channel control region, the central reference line being orthogonal to the top surface of the epitaxial drift layer.

In some embodiments, the substrate can include drain ohmic layer 2150 which is of a first conductivity type and has a first doping concentration. The epitaxial drift layer 2140 is of the first conductivity type (e.g., n−) and has a second doping concentration; the channel control region 2130 is of the first conductivity type and has a third doping concentration; the epitaxial source ohmic layer 2120 is of the first conductivity type (e.g., n++ in the embodiment of FIG. 21) and has a fourth doping concentration; and the gate region 2170 is of a second conductivity type (e.g., p+) and has a fifth doping concentration. The third doping concentration of the channel control region is different from the second doping concentration of the drift layer, which advantageously allows for a device which can withstand a desired breakdown voltage while still having a desirably small gate capacitance. In some embodiments, the second doping concentration of the drift layer and the third doping concentration of the channel control region are each less than the first doping concentration of the drain ohmic layer 2150 (in the substrate) and the fourth doping concentration of the source layer. The third doping concentration of the channel control region may range from, for example, $1\times10^{15}$ cm$^{-3}$ to $2\times10^{16}$ cm$^{-3}$. In some embodiments, the second conductivity type of the gate region comprises a modified SiC composition of the epitaxial channel layer.

In some embodiments, a total thickness of the epitaxial drift layer, measured along the vertical direction, ranges from 5.5 μm to 45.5 μm; the total thickness of the epitaxial drift layer has a total doping concentration relating inversely to the total thickness of the epitaxial drift layer; and the total doping concentration ranges from $1\times10^{15}$ cm$^3$ to $2\times10^{16}$ cm$^{-3}$.

Figure 22:
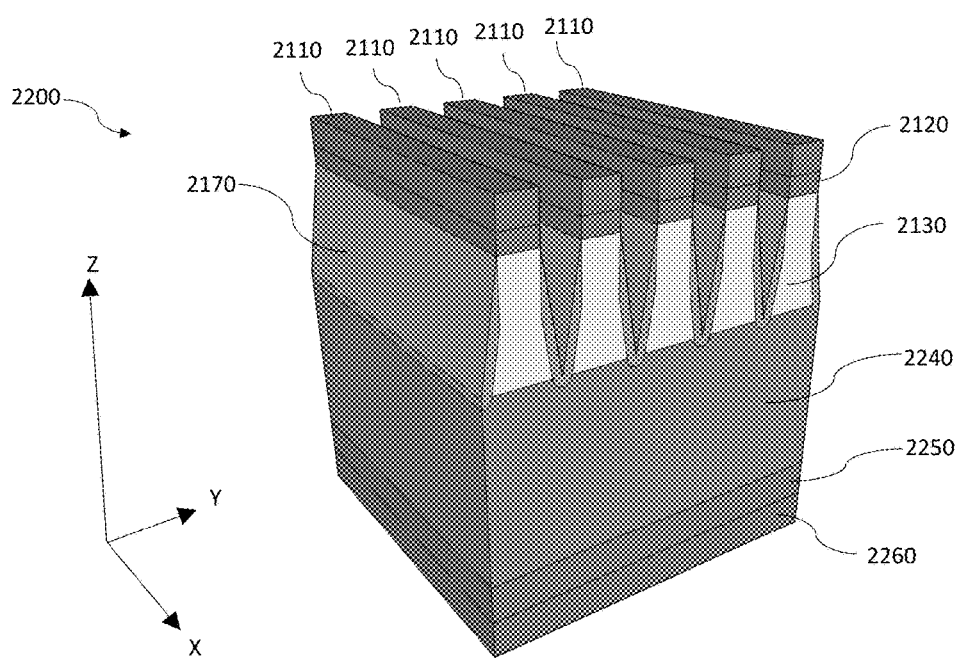
FIGS. 22 and 23 are perspective views of a vertical switch having a plurality of unit cells, in accordance with some embodiments.
Figure 23:
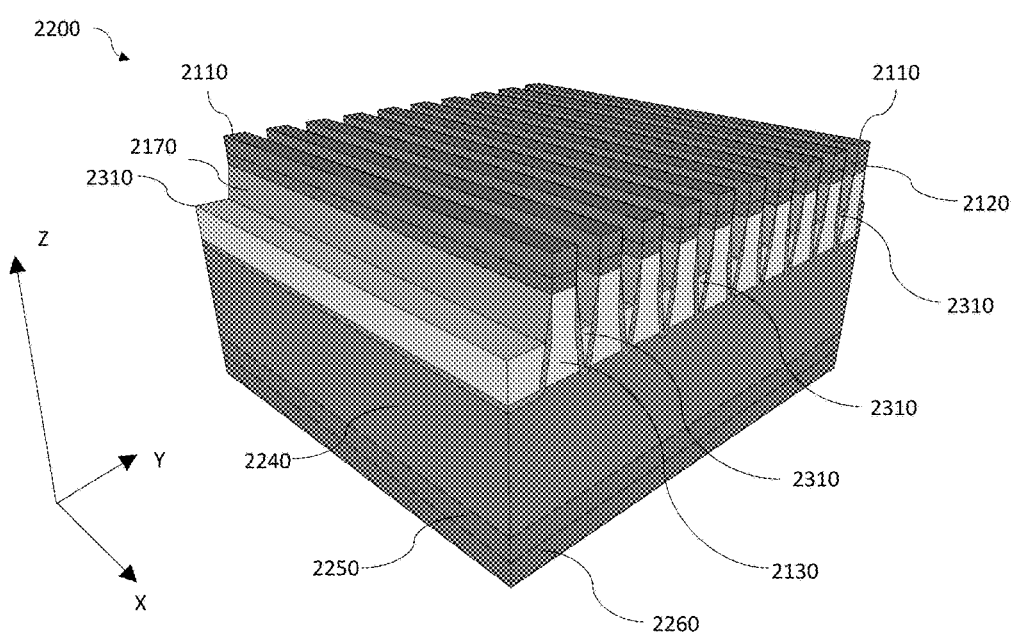

FIGS. 22 and 23 are perspective views of an overall 3-terminal switch device 2200, in which a plurality of unit cells, each having a predetermined sidewall slope, are integrated and disposed upon a common drift region 2240. The same reference numbering for components of FIG. 21 is used in FIGS. 22 and 23, with the exception that drift layer 2240, drain ohmic layer 2250, and drain electrode 2260 are shared between the plurality of unit cells.

An example of gate electrode formation is shown in FIG. 23 where gate electrode metallization 2310 is formed in valleys between the unit cells such that electrical contact can be formed to the p$^+$ gate regions 2170. The plurality of gate electrodes 2310 are electrically connected as single gate electrode, such as by forming an interdigitated comb of gate electrodes, or a two-dimensional array of islands. In some embodiments, the gate electrodes are deposited by an evaporation process using lithographic patterning and an etching process. Similarly, the source electrodes 2110 are electrically connected to form a single source electrode. The device 2200 shown in FIG. 23 is an example of implementing the sidewall slope channel control regions into a close packing architecture of spacing W$_{CELL}$ and is therefore area efficient.

In embodiments generally represented by FIGS. 22 and 23, a vertical conduction junction transistor can include a plurality of the multilayered semiconductor unit cells, where the substrate is shared by the plurality of the multilayered semiconductor unit cells; the epitaxial drift layer is shared by the plurality of the multilayered semiconductor unit cells; and the gate regions of the plurality of the multilayered semiconductor unit cells are electrically connected to form a common gate contact. In some embodiments, the epitaxial source layers of the plurality of the multilayered semiconductor unit cells are electrically connected to form a common source connection. In some embodiments, respective gate regions of the plurality of the multilayered semiconductor unit cells are electrically configured to provide a common control electrode which modulates a current flow vertically through the device.

Method of Manufacture

Methods of manufacturing the tapered 3-terminal vertical conduction SiC switch of the present embodiments shall now be described.

Figure 24:
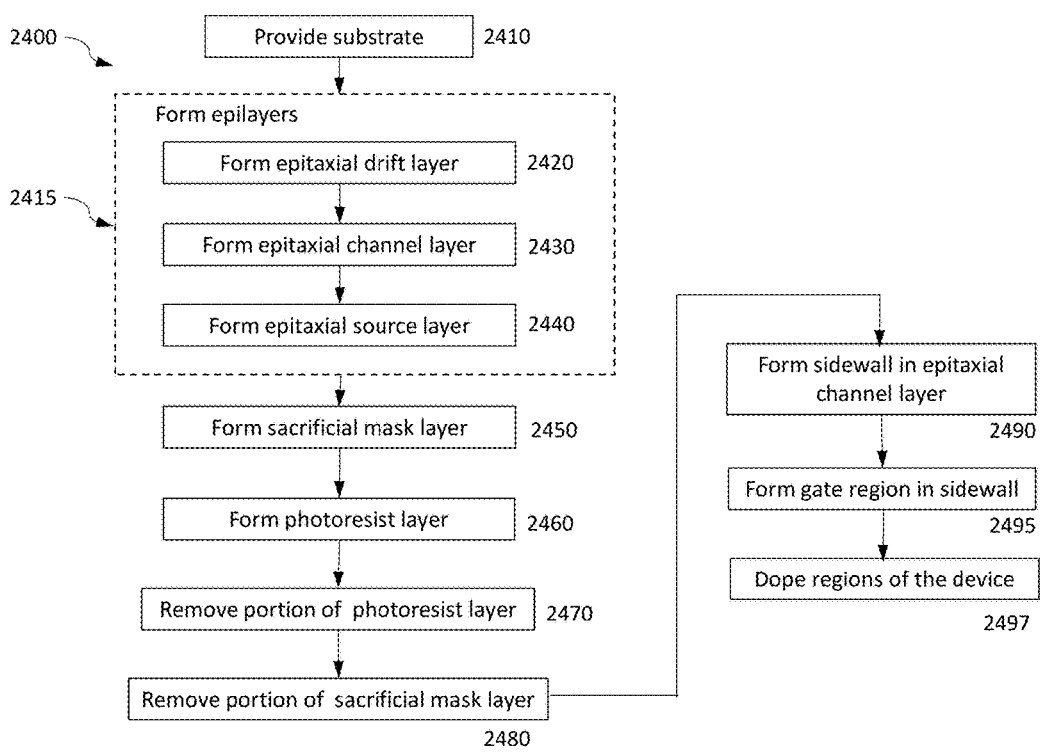
FIG. 24 is a flowchart of methods of manufacturing vertical conduction junction transistors, in accordance with some embodiments.

FIG. 24 is a flowchart 2400 of methods of manufacturing the vertical conduction junction transistors of the present embodiments. The transistors are 3-terminal switches implemented in an epilayer stack on a bulk SiC substrate, such as 4H—SiC, where the channel control region has a trapezoidal in shape and is bounded by gate regions formed in the sidewalls.

Step 2410 of flowchart 2400 involves providing a SiC substrate, where a vertical direction of the device is perpendicular to a top surface of the substrate. In step 2415, a plurality of epilayers comprising SiC is formed on the top surface of the substrate, where the plurality of epilayers includes an epitaxial channel layer. Step 2415 of forming a plurality of epilayers can include forming an epitaxial drift layer comprising SiC on the top surface of the substrate in step 2420; forming an epitaxial channel layer comprising SiC on a top surface the epitaxial drift layer in step 2430; and forming an epitaxial source layer comprising SiC on a top surface of the epitaxial channel layer in step 2440. In other embodiments, the drift layer may be formed within the substrate.

After the plurality of epilayers (i.e., epitaxial layers) have been formed in step 2415, the exposed parallel plane surfaces of the stack—that is, the topmost epilayer (e.g., the epitaxial source ohmic layer) and a bottommost surface of the substrate—are prepared for thin film coating and or deposition. Due to the chemical hardness of SiC-based semiconductors, aggressive etching methods must be utilized, such as reactive ion etching. In step 2450 a sacrificial mask layer (SML) is formed on a top surface of the plurality of epilayers (e.g., the top surface of epitaxial source layer), where the SML is used to attain the geometry specifications for the present devices. In step 2460 a photoresist (PR) layer is formed on a top surface of the SML. Steps 2470 and 2480 are discussed next with respect to FIG. 25.

Figure 25:
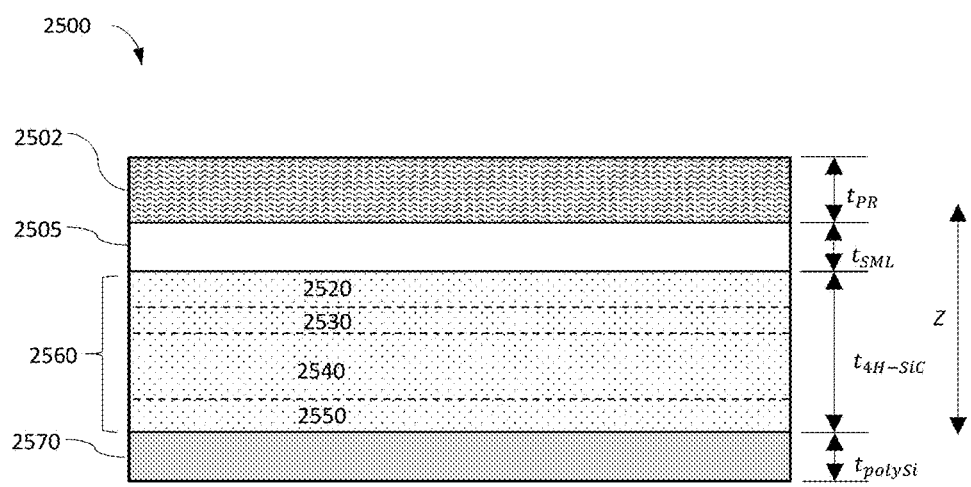
FIG. 25 is a vertical cross-section of a layer stack during an intermediate stage of fabrication, in accordance with some embodiments.

FIG. 25 shows an example layer stack 2500 during an intermediate stage of manufacturing. SiC article 2560 of the layer stack 2500 includes a bulk substrate 2550 and SiC epilayers (e.g., epitaxial drift layer 2540, epitaxial channel layer 2530 and epitaxial source layer 2520), as formed by steps 2410-2440 of FIG. 24. A sacrificial mask layer 2505 is deposited on epitaxial source layer 2520 (per step 2450 of FIG. 24), and photoresist layer 2502 is deposited on SML layer 2505 (step 2460 of FIG. 24). This embodiment also shows an optional backside coating (BSC) 2570 to the SiC substrate 2550. To leverage common silicon microelectronics processing tools, the SiC substrate 2550 can be coated with the BSC layer 2570 which may be, for example, doped polysilicon. Thicknesses "t" for the various layers are also shown in FIG. 25, where $t_{polySi}$ is the thickness for BSC layer 2570, $t_{4H-SiC}$ is the thickness of the SiC article 2560, $t_{SML}$ is the thickness of the SML 2505, and $t_{PR}$ is the thickness of PR layer 2502. Vertical direction Z is depicted in FIG. 25, which is a direction perpendicular to the top surface of the substrate 2550.

A gate control region of the transistor device is patterned by first designing and forming an optical mask for lithographic projection on the photoresist layer. The PR layer 2502 is used to pattern the SML 2505. The photoresist layer is selected with respect to the feature sizes required, the exposure wavelength used and the chemical properties for subsequent patterning. The use of photolithography with light typically in wavelengths of 193 nm, 248 nm, 365 nm and 400 nm on SiC necessitates the use of reflectance optimization layers. SiC at these exposure wavelengths is absorptive; however, the high refractive index of the material also presents a reflective surface. The SML serves two purposes: (i) a mask for spatially selective etching of the underlying SiC; and (ii) a reflectance optimization coating for the PR during exposure. Once the SML layer material and thickness are selected and deposited upon the epilayer surface of the SiC article, the PR is coated to the required thickness.

In flowchart 2400, step 2470 involves selectively removing a portion of the photoresist layer, where a remaining portion of the photoresist layer has a first feature that is at an angle to the vertical direction. First, the PR is exposed and patterned. The unexposed PR is then developed and removed leaving a patterned PR mask that can be used for selective etching of the SML. The SML material may be selected from at least one of: (i) a PECVD deposited silicon-oxide and or silicon nitride; (ii) a high temperature furnace-deposited and/or formed silicon oxide and or silicon nitride; (iii) a metallic metal such as aluminum (Al), aluminum-silicide ($AlSi_x$), tungsten (W), tungsten-silicide ($WSi_x$), tantalum (Ta), tantalum-silicide ($TaSi_x$), metal-nitrides (MN, e.g., M=Ti), metal-oxides (MO, M=Al) or nickel (Ni). The function of the PR exposure method and selection of the SML is to achieve a pre-selected sidewall slope of the mask edge.

In some embodiments, the SML is a bi-layered stack of dissimilar etch-rate materials. For example, the bi-layered stack may comprise a layer of silicon-oxide ($SiO_2$) and a layer of silicon-nitride ($Si_3N_4$), where in some embodiments the layer of $SiO_2$ can have a thickness greater than 1 μm. This bi-layered pattern dependent oxidation process (PADOX) can be used advantageously to control the etch shape of the sidewall during the etch process. That is, dissimilar etch rate materials can be used advantageously to modify the etched sidewall slope of the SiC region. In some embodiments, the bi-layered SML involves forming an ohmic metal contact layer on the top surface of the epitaxial source layer, where the ohmic metal contact layer (aluminum, for example) is interposed between the epitaxial source layer and the sacrificial mask layer. In further embodiments, the SML is a tri-layered stack having an ohmic semiconductor layer formed as a top epitaxial layer of the plurality of epilayers (e.g., the epitaxial source layer), a contact interlayer metal layer formed on a top surface of the ohmic semiconductor layer, and an ohmic metal contact layer formed on a top surface of the contact interlayer metal layer. In some embodiments, the ohmic metal contact layer is a hard implant mask.

Step 2480 of FIG. 24 involves selectively removing a portion of the sacrificial mask layer, after selectively removing of the portion of the photoresist layer, by using the remaining portion of the photoresist layer as a mask for the sacrificial mask layer. A remaining portion of the sacrificial mask layer has a second feature that is at an angle to the vertical direction. The second feature is used to form a sidewall in the epitaxial channel layer, the sidewall being at an angle to the vertical direction. Thus, the angle of the first feature in the photoresist and the angle of the second feature in the sacrificial mask layer are designed to produce the desired (i.e., predetermined) sidewall angle $\theta_{SW}$ of the epitaxial channel layer, where $\theta_{SW}$ is chosen as explained in relation to FIG. 17 and throughout this disclosure. The angle $\theta_{SW}$ of the sidewall measured relative to the vertical direction can be, for example, greater than 2 degrees and less than or equal to 30 degrees. Etch conditions are selected to enable advantageous translation of the sacrificial mask edge into the etched portion of the SiC material. Etch conditions can include, for example, ion/neutral ratio, chemical activity, and ion characteristics such as ion flux, angle, and energy. As shall be described in more detail later, the SML is consumed during the aggressive etch conditions, and the sidewall slope of the initial SML edge can be used to transfer the desired sidewall slope (i.e., angle) to the channel layer SiC edge. This SiC edge having a predetermined sidewall slope is used advantageously to develop an ion-implantation region for the channel control region. Once the SiC etch feature and endpoint is achieved the etch process is terminated. Optionally, the SML may be removed. In some embodiments the SiC feature that is being etched can be measured during the etching process to determine whether further etching is needed or to end etching and proceed with formation of the device. Etch conditions can be modified and the etching repeated until the desired geometry is achieved.

The optical properties of the SiC substrate present unique issues for photolithography compared to standard bulk Si substrates. Minimization of the reflection from the layer stack 2500 is desirable in order to maximize absorption within the selected photoresist at the exposure wavelength. In some embodiments, a 1-dimensional transfer matrix method (1D TMM) calculation can be used to optimize the geometry of the selected materials within the stack 2500. In some embodiments, metals such as aluminum are used advantageously for electrical interconnection to the regions necessary for the formation of the switch. Al is a highly reflective metal and thus alters the optimal SML and PR layer thickness to achieve optimal feature definition during photolithography.

Figures 26A, 26B:
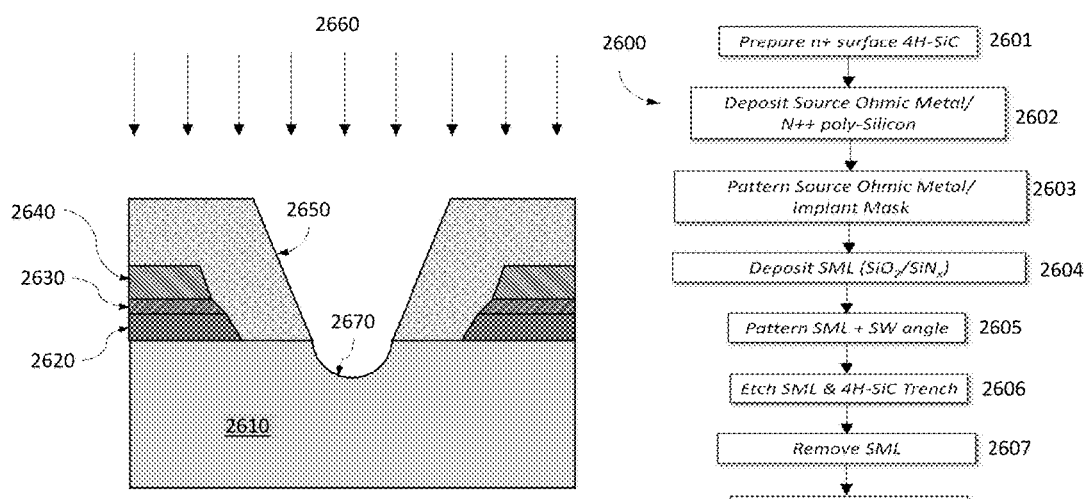
FIG. 26A is a vertical cross-section of a layer stack during etching of a sidewall, in accordance with some embodiments.
FIG. 26B is a flowchart of creating mask layers for etching of an angled sidewall, in accordance with some embodiments.

FIGS. 26A-26B show another embodiment in which the manufacturing methods incorporates a multilayered functional etch and implant mask. This method of SiC channel formation using a compound ion implant mask and SML uses a multiple patterned construct comprising an ohmic and metallic implant mask buried beneath the selected sidewall profile sacrificial mask layer. In the embodiment of FIG. 26A, an epilayer substrate structure 2610 is to be etched by a mask. The mask includes an optional ohmic semiconductor such as heavily doped n+ poly-silicon 2620, a contact interlayer metal such as TiN 2630, and an ohmic metal contact and hard implant mask such as Al-metal 2640. Next the SML such as PECVD $SiO_2$ 2650 is patterned. The sidewall edge slopes 2650 are indicated and used advantageously with RIE/IBE 2660 to etch 2670 the SiC semiconductor material. The mask doubles as an Al+ Al implant mask and an ohmic polySi/TiN contact for Al.

Process flow 2600 in FIG. 26B describes general steps for creating compound metal/semi/non-metal mask comprising implant mask layers. In step 2601, an n+4H—SiC surface of epilayer substrate structure 2610 is prepared for etching. In step 2602, source ohmic 2620, metal 2630, and N++ poly-silicon 2640 are deposited, and in step 2603, the source ohmic metal/implant mask is patterned. The SML, such as $SiO_2$ and/or $SiN_X$, is deposited in step 2604. The SML and sidewall angle are patterned in 2605, followed by step 2606 of etching of the SML and 4H—SiC trench in substrate structure 2610. The SML is removed in step 2607, and finally p+ regions (e.g., gate regions 2170 of FIG. 21) are implanted into the formed sidewalls in step 2608.

Figure 27:
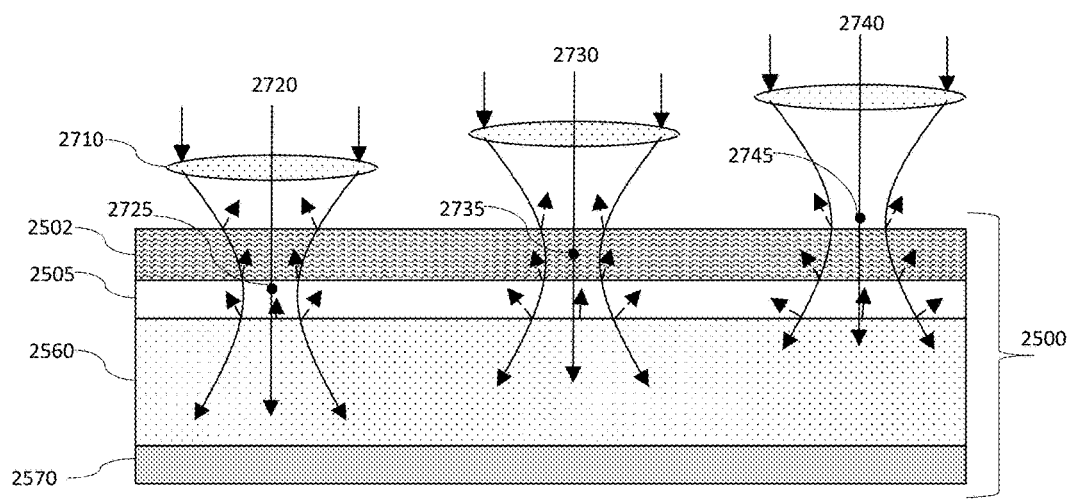
FIG. 27 is a vertical cross-sectional view showing exposure of a photoresist stack, in accordance with some embodiments.

The use of transparent substrates such as SiC also necessitates careful exposure of the photoresist stack as shown in FIG. 27, where photoresist stack 2500 includes PR layer 2502, SML 2505, SiC article 2560 and BSC layer 2570. Features patterned in the PR layer 2502 depend strongly upon the relative lithographic focus as shown by depth of focus configurations shown in FIG. 27. Optical beams are shown having focal widths 2710 that vary along a focal depth. Deep focus condition 2720 has a focus point 2725 well in the photoresist stack, such as within SML 2505. Tight focus condition 2730 has a focus point 2735 within PR layer 2502, and near focus condition 2740 has a focus point 2745 above the photoresist stack 2500.

Figure 28A:
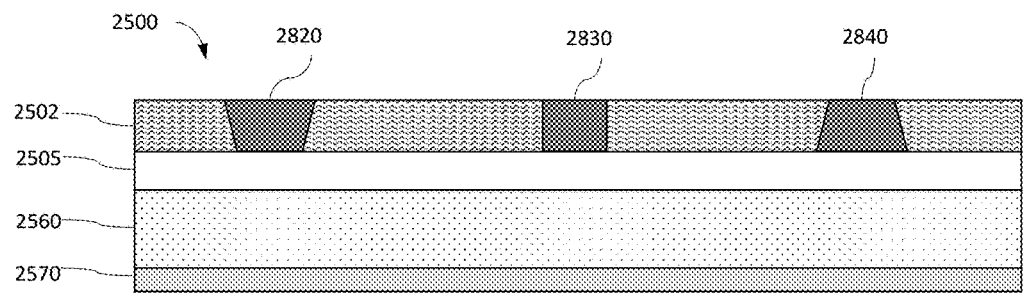
FIGS. 28A-28B are vertical cross-sections showing features formed in a photoresist layer during fabrication of an angled sidewall, in accordance with some embodiments.
Figure 28B:
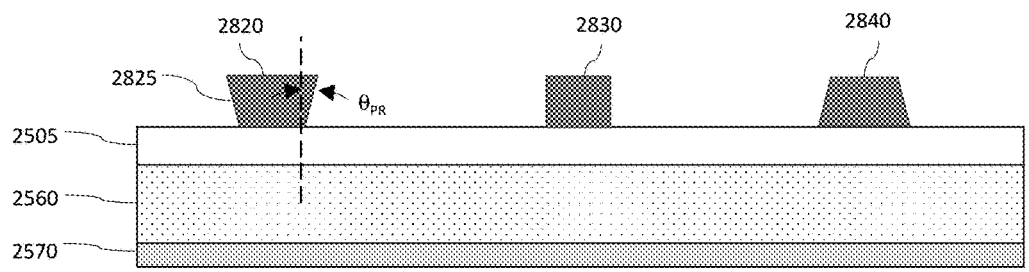

FIGS. 28A-28B show the resulting PR features, represented by the shaded rectangular and trapezoidal shapes, due to the focusing conditions of FIG. 27. FIG. 28A shows the photoresist 2502 before development, while FIG. 28B is after development and removal of the unexposed PR. Accordingly, in some embodiments selective removal of a portion of the photoresist layer includes exposing the photoresist layer to an optical beam, the optical beam having a focal width that varies along a focal depth, where a minimum of the focal width is above a top surface of the photoresist layer.

Trapezoid feature 2820 with its longer base side at the top results from deep focus condition 2720. Rectangular feature 2830 results from tight focus condition 2730. Trapezoid feature 2840 with its longer base side at the bottom results from the near focus condition 2740. A desirable exposure is the shape represented by feature 2820, which presents a sidewall slope 2825 at the exposed PR edge, such that the feature 2820 is at an angle to the vertical section. The sidewall of the photoresist feature 2825 is angled such that the pattern feature 2820 is tapered downward, with an outward angle $\theta_{PR}$. FIG. 28B shows the PR exposed features 2820, 2830 and 2840 after developing and removal of the unexposed PR. The sidewall edge slope 2825 of feature 2820 is desirable for subsequent dry etching of the SML.

Figure 29A:
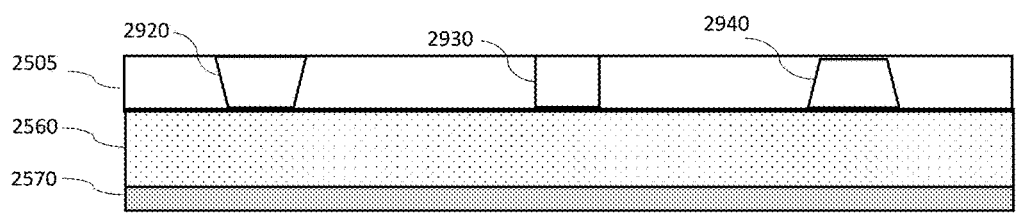
FIGS. 29A-29B are vertical cross-sections showing features formed in a sacrificial mask layer during fabrication of an angled sidewall, in accordance with some embodiments.
Figure 29B:
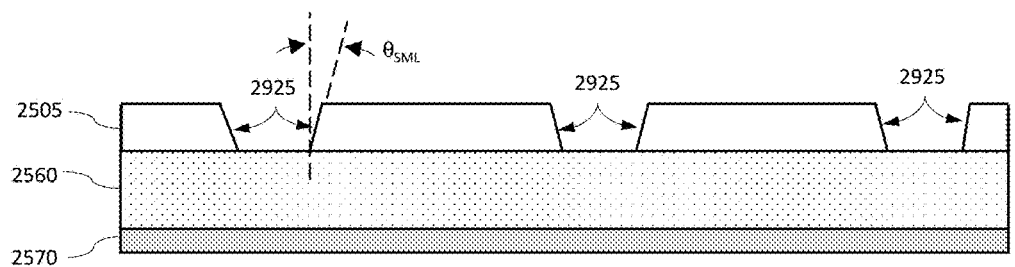

FIG. 29A shows feature shapes that are possible in the SML layer 2505, resulting from the PR features of FIG. 28B. In FIG. 29A, SML feature 2920 results from PR feature 2820, SML feature 2930 results from PR feature 2830, and SML feature 2940 results from PR feature 2840. The features created in FIG. 29A follow the shapes of FIG. 28B but may be more diffuse since the PR shapes of FIG. 28B are optically exposed. FIG. 29B represents an embodiment of an SML 2505 having sidewall features 2925 all produced by SML feature 2920 that can be used advantageously for SiC trench formation having a desirable sidewall slope. The feature 2925 has a sidewall that is an angle $\theta_{SML}$ with respect to the vertical direction.

In step 2490 of FIG. 24, the angled feature of the sacrificial mask layer is used to form a sidewall in the epitaxial channel layer of a plurality of epilayers of the SiC stack, the sidewall being at an angle to the vertical direction. In step 2495 a gate region is formed in the sidewall, the gate region having an inner gate region boundary that is parallel to the sidewall. A channel control region in the channel layer has a width bounded by the inner gate region boundary and has a cross-section that is trapezoidal in a plane taken in the vertical direction. The various epitaxial layers of the vertical conduction junction transistor device can have doping concentrations that are designed to achieve a high voltage breakdown as described in relation to FIGS. 5-7 and throughout this disclosure. Accordingly, the method of flowchart 2400 can also include step 2497 of doping the various regions and layers of the device. For example, step 2497 can include doping the substrate with a first conductivity type and a first doping concentration, doping the epitaxial drift layer with the first conductivity type and a second doping concentration, doping the channel control region with the first conductivity type and a third doping concentration, doping the epitaxial source layer with the first conductivity type and a fourth doping concentration, and forming a gate region in the sidewall by doping the sidewall with a second conductivity type and a fifth doping concentration, where the third doping concentration is different from the second doping concentration. In some embodiments, the second doping concentration and the third doping concentration are each less than the first doping concentration and the fourth doping concentration.

Known wet chemistry and dry etching processes have demonstrated that SiC materials are challenging to etch due to the hardness and chemical stability. Furthermore, selectively etching SiC with respect to conventional mask materials, such as, oxides, nitrides and refractory metals, is also an issue. Typically, reactive ion etching (RIE) is employed for attempts to achieve material selective etching whereas ion beam etching (IBE) can be employed for non-specific materials etching and etching simultaneously processing of stacked dissimilar materials. There is usually a material-specific etch rate which must be optimized for achieving the required process.

The chemical hardness of crystalline SiC semiconductor material, and the slower RIE etch rates typically possible with respect to conventional mask materials (e.g., hard baked photoresists, $SiO_2$ and $Si_3N_4$), is generally understood to be a severe limitation to the formation of high aspect ratio vertical sidewall features. Metal mask layers are typically used to reduce mask erosion but also result in significant metal mask species sputter coating into the etched trench features. The present methods advantageously seek mask erosion processes in controlled methods to attain the desired angle sidewall during the masked etch process of SiC under RIE conditions.

FIGS. 30A-30B provide insight into methods of using a predetermined mask erosion process during RIE to create an angled sidewall in SiC. In FIG. 30A a particle-in-cell (PIC) approach 3000 utilizes a conventional Monte-Carlo (MC-PIC) algorithm for creating random ion trajectories 3020 selected from a position in the source plane, along with a characteristic ion angle selected from a positive ion angular distribution representing a particular plasma geometry and excitation type. A finite element spatial discretization of a SML mask 3045 patterned and disposed upon a SiC substrate stack 3050 is shown. The plasma plane is represented by 3005, which can direct ions toward the etch surface 3042 and is separated from etch surface 3042 by a gap 3015. Each iteration of the MC-PIC algorithm selects a random ion position 3010 from the source plane 3005. For example, an ion 3030 is directed ballistically toward the surface impacting a surface species located at position 3040. Each ion impact on the particular surface species is accumulated and stored as an impact count. When the count exceeds a threshold for the given surface species it is removed from the location. The threshold level for a given species can be selected to correspond to known physical properties observed in RIE/IBE process. Nearest neighbor interactions are also included as shown schematically in the close-up section 3090 of FIG. 30B, where the ion 3030 impacts site coordinates (i,k) accumulating ion impact count N(i,k,S) for species S=SiC. Interactions from the nearest neighbors N(i−1, k, S), N(i+1, k, S), and N(i+1, k+1, M) are taken into account, where species M=mask.

Figure 31:
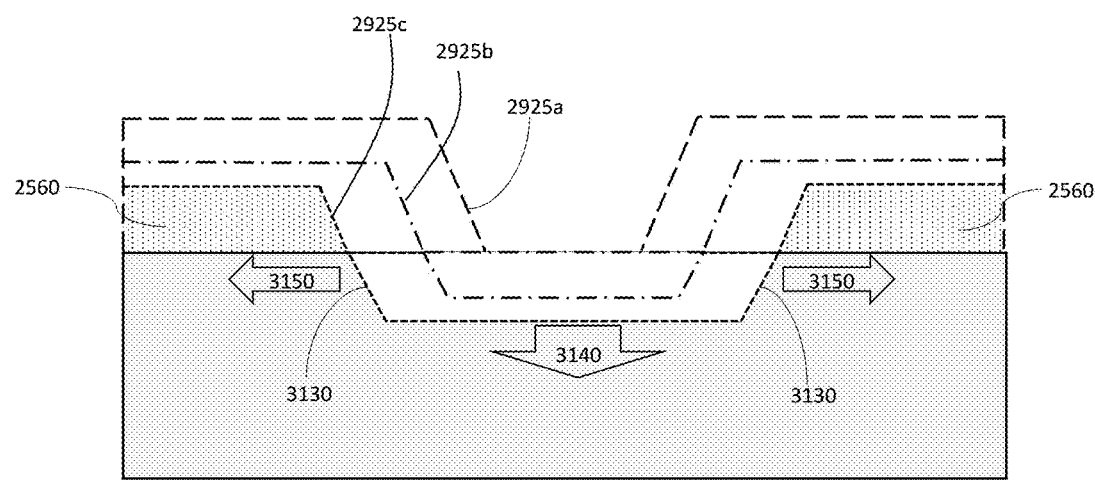
FIG. 31 is a vertical cross-section illustrating a mask layer during etching of an angled sidewall, in accordance with some embodiments.

The MC-PIC process further initiates the RIE/IBE etch process with a predetermined mask layer having a sidewall slope as shown in FIG. 31. An initial mask layer 2925a (created as described in FIGS. 29A-B) is eroded, as shown by stages 2925b and 2925c, by the etch process at a typically faster rate than the underlying SiC layer 2560 (although the reverse case is also possible). As the mask layer sidewall and mask thickness is eroded by the bombarding ions, this creates the SiC etch feature which propagates laterally 3150 and vertically 3140, as shown in FIG. 31. The resulting SiC trench profile 3130 which is temporally exposed as a function of the etch time is determined by: (i) the ion etch threshold or rate for each material; (ii) the mask erosion etch rate; and (iii) the initial mask sidewall slope. RIE/IBE processes for SiC are typically created by high density plasmas, comprising both energetic positive ions (with number density $N_{ion}$) and a smaller concentration of reactive neutral (with number density $nn_0$) species. The ratio of ballistic ions relative to the reactive neutral species $\xi=nn_0/N_{ion}$, can be used to observe the effect on SiC etch profiles. Neutral species are simulated with MC-PIC as being generated within the plasma region and diffuse to the surface randomly and subsequently attach to a particular surface site, thereby increasing the accumulation counter for the said surface site. The mask sidewall slope (of 2925a, b, c) is transferred into the SiC trench 3130 and is shown to increase for plasma ion concentrations $\xi \rightarrow 0$ in the RIE process. Note, $\xi=1 \Rightarrow RIE \equiv IBE$. For the case of high neutral content, $\xi \rightarrow 1$, the sidewall slope of the SiC tracks the initial mask sidewall slope. In some embodiments, the SiC sidewall slopes can be in the range of $0 \leq \theta_{SW} \leq 30°$. In the present embodiments, the SiC material 2560 can be the channel layer of the vertical conductor junction transistor device. Thus, SiC trench 3130 shapes the sidewall of the channel layer and the remaining, non-etched material of 2560 becomes the channel control region having a trapezoidal cross-section.

Figure 32A:
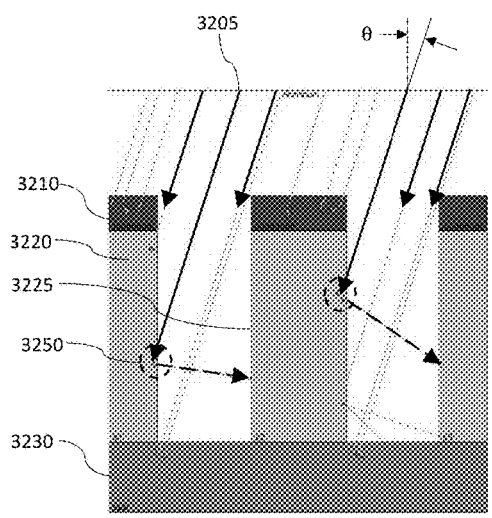
FIGS. 32A-32B are vertical cross-sections showing ion implantation of straight and angled sidewalls.
Figure 32B:
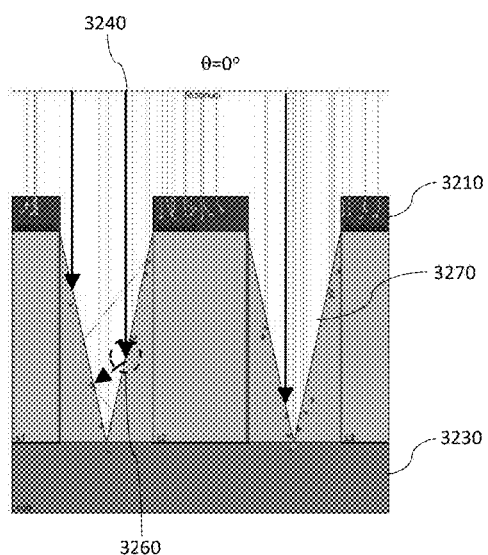

The angled sidewall feature in SiC material of the present embodiments can be used for improved ion-implant process, such as to create a gate region in the channel layer. Referring to FIGS. 32A-32B, shown are two types of etched features in SiC, namely, straight sidewall (FIG. 32A) and angled sidewall trenches (FIG. 32B).

In some embodiments, converting the conductivity type of the sidewall is performed post-physical etch. In some embodiments, conversion of n-type SiC material is achieved via Al+ ion implantation to create a p-type region, although other ion species and methods are also possible. Referring to FIG. 32A, a mask 3210 has etched a SiC feature 3220, which is on an underlying stack 3230. The straight sidewall 3225 of the etched feature 3220 requires an angled ion-implantation trajectory 3205 to create the doped region on just one side (for example impact site 3250) of the pillar. Therefore, a plurality of opposing angled ion implantation trajectories directed at the upright surfaces is required to fully implant the straight sidewalls. Unfortunately, optimal ion-implant angles and a plurality of ion-implant angles increase the processing cost for the device. In contrast, in FIG. 32B, the initial starting structure with an angled SiC sidewall 3270, as in the present embodiments, enables a single substantial normal incident ion trajectory 3240 having impact site 3260, to implant the surfaces. Ion-implantation is accurately simulated using Monte Carlo interactions of energetic ions with amorphous and crystalline materials.

Al-ion implantation is typically one of the most effective p-type dopant species into 4H—SiC. Post ion-implantation requires a high temperature activation process which is typically in excess of 1500° C., such as approaching 1700-1800° C. or beyond. A special issue with SiC during such a high temperature activation anneal is the selective sublimation of Si atom species from within the SiC host crystal and more specifically, near the surface region. This potentially leads to graphitization of the surface of the top most surface region. This carbon-rich surface is disadvantageous for subsequent ohmic metallization. A method to reduce this carbon-rich surface formation is the use of high energy Si+ ion implantation. Using Si+ ion implantation to increase a surface region with Si atoms enables reduction in the carbonization process during high temperature activation anneal of implanted Al+ ions. A post ion-implantation recrystallization process during a dopant activation anneal is improved if the dopant resides in an amorphized host and less so in a partially amorphized host. The Si+ ion implantation can be used to further amorphize the SiC surface region which is implanted by Al+ ions. The Si+ ion implant can be either before or after Al+ ion implant as discussed herein.

In the present embodiments, the implant depths and concentrations of co-doping Si+ and Al+ may be utilized as an advantageous process for improving the p-type gate region formation in the angled sidewall process. Forming the gate region in the sidewall may include implanting a first ion species into the sidewall, the first ion species having a first ion trajectory in the vertical direction, and raising a temperature of the sidewall to an ion activation temperature. In some embodiments, the first ion species comprises aluminum (Al+) ions. In further embodiments, before raising the temperature of the sidewall to the ion activation temperature, the method includes implanting a second ion species into the sidewall, the second ion species having a second ion trajectory that is in the vertical direction. The ion activation temperature may be, for example, greater than 1800° C. In some embodiments, the first ion species comprises silicon (Si+) ions and the second ion species comprises silicon (Si+) ions.

In further embodiments, forming the gate region in the sidewall comprises modifying a composition of the SiC in the epitaxial channel layer. That is, the second conductivity type of the gate region is achieved by modification of the composition of the SiC material in the channel layer. The modified composition may be, for example, silicon-rich SiC, carbon-rich SiC, an alloy of SiGeC, or transformation of a portion of the SiC region into a compound semiconductor. In yet other embodiments, the second conductivity type of the gate region is achieved by selective area epitaxy of doped-SiC and alternately a non-SiC selective area epitaxy gate region.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A vertical conduction junction transistor apparatus comprising:
   a multilayered semiconductor unit cell comprising:
   a substrate, the substrate being a silicon carbide (SiC) substrate, wherein a vertical direction of the multilayered semiconductor unit cell is perpendicular to a top surface of the substrate;
   an epitaxial drift layer comprising SiC formed on the top surface of the substrate;
   an epitaxial channel layer comprising SiC formed on a top surface of the epitaxial drift layer, wherein a sidewall of the epitaxial channel layer is at an angle to the vertical direction such that the epitaxial channel layer is tapered;
   a gate region formed in the sidewall of the epitaxial channel layer, the gate region having an inner gate region boundary that is parallel to the sidewall; and
   a channel control region in the epitaxial channel layer, the channel control region having a width bounded by the inner gate region boundary and having a trapezoidal cross-section in a plane taken in the vertical direction.

2. The apparatus of claim 1, further comprising an epitaxial source layer comprising SiC formed on a top surface of the epitaxial channel layer, wherein:
   the substrate comprises a drain layer of a first conductivity type and with a first doping concentration;
   the epitaxial drift layer is of the first conductivity type and has a second doping concentration;
   the channel control region is of the first conductivity type and has a third doping concentration;
   the epitaxial source layer is of the first conductivity type and has a fourth doping concentration;
   the gate region is of a second conductivity type and has a fifth doping concentration; and
   the third doping concentration is different from the second doping concentration.

3. The apparatus of claim 2, wherein the second doping concentration and the third doping concentration are each less than the first doping concentration and the fourth doping concentration.

4. The apparatus of claim 2, wherein the second conductivity type of the gate region comprises a modified SiC composition of the epitaxial channel layer.

5. The apparatus of claim 1, further comprising a plurality of the multilayered semiconductor unit cells, wherein:
   the substrate is shared by the plurality of the multilayered semiconductor unit cells;
   the epitaxial drift layer is shared by the plurality of the multilayered semiconductor unit cells; and
   the gate regions of the plurality of the multilayered semiconductor unit cells are electrically connected to form a common gate contact.

6. The apparatus of claim 1, wherein:
   a total thickness of the epitaxial drift layer measured along the vertical direction ranges from 5.5 µm to 45.5 µm;
   the total thickness of the epitaxial drift layer has a total doping concentration relating inversely to the total thickness of the epitaxial drift layer; and
   the total doping concentration ranges from $1\times10^{15}$ cm$^{-3}$ to $2\times10^{16}$ cm$^{-3}$.

7. The apparatus of claim 1, wherein an angle of the sidewall measured relative to the vertical direction ranges from 2 degrees to 30 degrees.

8. The apparatus of claim 1, wherein a first width of the channel control region at the top surface of the epitaxial channel layer is less than a second width of the channel control region at a bottom surface of the epitaxial channel layer.

9. The apparatus of claim 1, wherein:
the substrate is a bulk single crystal 4H—SiC substrate;
the epitaxial drift layer is a single-crystal 4H—SiC film; and
the epitaxial channel layer is a single-crystal 4H—SiC film.

10. A method for forming a vertical conduction junction transistor, the method comprising:
providing a substrate, the substrate being a silicon carbide (SiC) substrate, wherein a vertical direction of the vertical conduction junction transistor is perpendicular to a top surface of the substrate;
forming a plurality of epilayers comprising SiC on the top surface of the substrate, the plurality of epilayers comprising an epitaxial channel layer;
forming a sacrificial mask layer on a top surface of the plurality of epilayers;
forming a photoresist layer on a top surface of the sacrificial mask layer;
selectively removing a portion of the photoresist layer, wherein a remaining portion of the photoresist layer has a first feature that is at an angle to the vertical direction;
selectively removing a portion of the sacrificial mask layer by using the remaining portion of the photoresist layer as a mask, wherein a remaining portion of the sacrificial mask layer has a second feature that is at an angle to the vertical direction;
using the second feature to form a sidewall in the epitaxial channel layer, the sidewall being at an angle to the vertical direction; and
forming a gate region in the sidewall, the gate region having an inner gate region boundary that is parallel to the sidewall;
wherein a channel control region in the channel layer has a width bounded by the inner gate region boundary and has a cross-section that is trapezoidal in a plane taken in the vertical direction.

11. The method of claim 10, wherein the sacrificial mask layer comprises a bi-layered stack of dissimilar etch-rate materials.

12. The method of claim 10, wherein the sacrificial mask layer comprises a tri-layered stack, the tri-layered stack comprising:
an ohmic semiconductor layer formed as a top epitaxial layer of the plurality of epilayers;
a contact interlayer metal layer formed on a top surface of the ohmic semiconductor layer; and
an ohmic metal contact layer formed on a top surface of the contact interlayer metal layer, the ohmic metal contact layer being a hard implant mask.

13. The method of claim 10, wherein selectively removing the portion of the photoresist layer comprises:
exposing the photoresist layer to an optical beam, the optical beam having a focal width that varies along a focal depth, wherein a minimum of the focal width is above a top surface of the photoresist layer.

14. The method of claim 10, wherein forming the gate region in the sidewall comprises:
implanting a first ion species into the sidewall, the first ion species having a first ion trajectory in the vertical direction; and
raising a temperature of the sidewall to an ion activation temperature.

15. The method of claim 14, wherein forming the gate region in the sidewall further comprises:
before raising the temperature of the sidewall to the ion activation temperature, implanting a second ion species into the sidewall, the second ion species having a second ion trajectory that is in the vertical direction.

16. The method of claim 10, wherein forming the gate region in the sidewall comprises modifying a composition of the SiC in the epitaxial channel layer.

17. The method of claim 10, wherein:
the forming of the plurality of epilayers comprises:
forming an epitaxial drift layer comprising SiC on the top surface of the substrate;
forming the epitaxial channel layer comprising SiC on a top surface the epitaxial drift layer; and
forming an epitaxial source layer comprising SiC on a top surface of the epitaxial channel layer; and
the method further comprises:
doping the substrate with a first conductivity type and a first doping concentration;
doping the epitaxial drift layer with the first conductivity type and a second doping concentration;
doping the channel control region with the first conductivity type and a third doping concentration;
doping the epitaxial source layer with the first conductivity type and a fourth doping concentration; and
forming the gate region in the sidewall by doping the sidewall with a second conductivity type and a fifth doping concentration;
wherein the third doping concentration is different from the second doping concentration.

18. The method of claim 17, wherein the second doping concentration and the third doping concentration are each less than the first doping concentration and the fourth doping concentration.

19. The method of claim 10, wherein the angle of the sidewall measured relative to the vertical direction is greater than 2 degrees and less than or equal to 30 degrees.

20. The method of claim 10, wherein a first width of the channel control region at a top surface of the channel control region is less than a second width at a bottom surface of the channel control region.

* * * * *